(12) United States Patent
Takemura

(10) Patent No.: US 7,239,562 B2
(45) Date of Patent: Jul. 3, 2007

(54) SEMICONDUCTOR DEVICE

(75) Inventor: Riichiro Takemura, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/313,833

(22) Filed: Dec. 22, 2005

(65) Prior Publication Data
US 2006/0158922 A1    Jul. 20, 2006

(30) Foreign Application Priority Data
Dec. 24, 2004  (JP)  ............... 2004-374314

(51) Int. Cl.
*G11C 7/10* (2006.01)
(52) U.S. Cl. .................. 365/189.08; 365/189.02; 365/148
(58) Field of Classification Search .......... 365/189.08, 365/189.02, 148
See application file for complete search history.

(56) References Cited

U.S. PATENT DOCUMENTS 6,243,290 B1 *  6/2001  Kurata et al. .......... 365/185.03
6,876,575 B2 *  4/2005  Hidaka .................. 365/171
6,882,557 B2 *  4/2005  Kajigaya et al. ........ 365/63
7,030,438 B2 *  4/2006  Sekiguchi et al. ...... 257/296

OTHER PUBLICATIONS

Woo Yeong Cho et al., "A 0.18μm 3.0V 64Mb Non-Volatile Phase-Transition Random-Access Memory (PRAM)," 2004 IEEE International Solid-State Circuits Conference, Digest of Technical Papers, pp. 40-41 (2004).

* cited by examiner

*Primary Examiner*—Tuan T. Nguyen
(74) *Attorney, Agent, or Firm*—Miles & Stockbridge P.C.

(57) ABSTRACT

In a semiconductor device particularly including a phase change material, the reliability of the read-out operation is improved. In a read-out operation of a phase change memory, a bit line to be read out is precharged in advance with a sufficiently low voltage that can prevent the destructive read operation. In this state, after a word line is activated and a period in which the voltage is sufficiently discharged via a storage element which is in a low resistance state elapses (first read out), charge sharing is performed between the bit line and a read bit line of a sense amplifier which is precharged to a high voltage, and a read-out operation is performed again (second read out). Consequently, the read-out signal amount can be increased while suppressing the read current.

20 Claims, 26 Drawing Sheets

US 7,239,562 B2

SEMICONDUCTOR DEVICE

CROSS-REFERENCE TO RELATED APPLICATION

The present application claims priority from Japanese Patent Application No. JP 2004-374314 filed on Dec. 24, 2004, the content of which is hereby incorporated by reference into this application.

TECHNICAL FIELD OF THE INVENTION

The present invention relates to a semiconductor device. More particularly, it relates to a technology effectively applied to a semiconductor device having an integrated memory circuit, a logic-embedded memory in which memory circuits and logic circuits are provided on one semiconductor substrate, or an analog circuit, each of which is formed by using a phase change material.

BACKGROUND OF THE INVENTION

According to an examination by the inventor of the present invention, the followings are known as the technologies for a memory using a phase change material.

Phase change memories have been under development in order to produce high-speed and large-scale integrated non-volatile memories. A memory (phase change memory) employing resistive elements made of a phase change material is a non-volatile memory, in which a temperature change such as that shown in FIG. 31 is caused by use of electrical pulses so as to cause a phase transition of a phase change material between an amorphous state and a crystalline state, and by doing so, the difference in resistance values between the amorphous state (reset) and the crystalline state (set) of the phase change material is recorded as information as shown in FIG. 32. Note that, for the high resistance value of the amorphous state and the low resistance value of the crystalline state of the phase change material, a completely amorphous state and a completely crystalline state are not required. As a storage element, it is important to have sufficient difference in resistance between a high resistance state and a low resistance state, and the resistance values can be arbitrary intermediate values between a completely amorphous high-resistance state and a completely crystalline low-resistance state.

As described above, the phase change element changes the phase state thereof by electrical pulses. In order to perform a reset, a large current has to flow for a short period so as to rapidly cool the element. On the other hand, in order to perform a set, a current smaller than that in the reset has to flow for a comparatively long time so as to slowly cool the element. Meanwhile, in a read-out operation, the speed of a voltage drop in a bit line is sensed by use of a read voltage which is sufficiently lower than the write voltages, thereby reading out a '0' state or a '1' state of the phase change memory.

As a read-out method of a phase change memory, for example, a technology that enables easy setting of a sense amplifier reference level by amplifying input signals to the sense amplifier by use of a charge-transfer type preamplifier is disclosed in "2004 IEEE International Solid-State Circuits Conference, Digest of Technical Papers", pp. 40 to 41 (Non-Patent Document 1).

SUMMARY OF THE INVENTION

Incidentally, as a result of the examination by the inventor of the present invention for the technology of a memory using a phase change material described above, the following facts have been found.

In the phase change memory, currents are caused to flow in an element both in a read-out operation and a write operation. In the write operation, the phase state of an element is changed between an amorphous state (high resistance state) and a crystalline state (low resistance state) by Joule heat generated by causing a large current to flow through a resistor itself or an adjacently disposed heater.

On the other hand, in the read-out operation, since a current is caused to flow through the element or the adjacent heater, the data in the element may be destroyed by Joule heat generated by the current. Also, there is a possibility that, when a read current flows, a thermal disturbance larger than expected is generated due to the influence of, for example, fluctuations in the internal voltage, the outside temperature, and element variations, and the stored data in peripheral memory elements are destroyed. Therefore, it is a task to reduce the applied voltage in the read out as much as possible so as to reduce the current that flows through the element and the heater and to reduce the amount of generated heat.

The methods of detecting the low resistance state and the high resistance state include a current sensing method in which a certain voltage is applied to the element and the current that flows through the element is compared with a reference current to detect the states, and a voltage sensing method in which a capacitive load is charged or discharged via the memory element and the voltage value after a certain time is compared with a reference voltage to detect the states. Since the scale of a sense circuit is large in the current sensing method, the voltage sensing is more suitable for an operation in which a large number of bits are read out at a time. However, in the voltage sensing method, when the applied voltage in the read out is low, the difference between the reference voltage and the read voltage becomes small. Therefore, it is a task to generate a stable reference voltage.

Under such circumstances, for example, a method employing a charge-transfer type preamplifier is disclosed in the above mentioned Non-Patent Document 1. However, in the method described in Non-Patent Document 1, since it does not operates as the preamplifier in some cases unless the gate voltage of a pass-gate transistor constituting the charge-transfer amplifier is well adjusted, the amplitude of the sense amplifier input signal can not be increased.

The typical ones of the inventions disclosed in this application will be briefly described as follows.

A semiconductor device according to the present invention comprises: a plurality of word lines; a first bit line; a sense amplifier; a plurality of memory cells disposed at arbitrary intersecting points of the plurality of word lines and the first bit line; a second bit line and a third bit line connected to the sense amplifier; a first switch for providing a first potential to the first bit line; a second switch for providing a second potential to the second bit line; and a third switch for connecting the first bit line with the second bit line, wherein, after the first switch is inactivated, any of the plurality of word lines is activated, and the third switch is activated.

More specifically, in a read-out operation, first, the word line of the memory cell is raised in a state where the first bit line to which the memory cell is connected is precharged in advance to a first potential, thereby charging/discharging electric charge of the first bit line via the memory cell. Then, the first bit line is connected to the second bit line which has been precharged to the second potential in advance and is connected to one of the input nodes of the sense amplifier, thereby charging/discharging the first bit line again via the memory cell and obtaining an input signal of the sense amplifier from the second bit line having a potential equal to the first bit line.

When gradual charge/discharge is employed in the above-described manner for obtaining a desired voltage amplitude as an input signal of the sense amplifier, the amount of electric charge involved in one time of charge/discharge is reduced and the current and the voltage are reduced as a result of the reduction in the amount of electric charge, and therefore, heat generation of the memory cell can be suppressed. Consequently, a highly reliable read-out operation can be performed.

Also, a third bit line serving as a reference is connected to the other input node of the sense amplifier. For the signal inputted to this bit line, a third potential serving as a fixed voltage may be generated by use of, for example, an internal power-supply step-down circuit, or a fourth bit line which is disposed in parallel to the first bit line and is in an unselected state during the read out may be employed.

In the latter case, for example, the third bit line and the fourth bit line are connected to each other in a state where the third bit line is precharged to the second potential which is higher than the first potential similar to the second bit line, and the fourth bit line is precharged to a fourth potential which is lower than the first potential since it is in an unselected state. Accordingly, a signal at an approximately intermediate level between 'H' level signal and an 'L' level signal which are read out to the second bit line can be supplied to the third bit line as a reference. At this time, since the reference voltage is generated in the third bit line by a mechanism which is similar to that of the read out of the signal to the second bit line, a stable reference voltage with a high tolerance against noise due to the voltage variations and manufacturing variations can be generated.

In addition, the reason why the unselected fourth bit line is set to the fourth potential is to suppress the voltage application to the memory cells which are connected to the fourth bit line during a period such as a waiting period when read and write to the memory cells are not required. Therefore, not only the fourth bit line but also the bit lines connected to the memory cells are set to the fourth potential by use of switches except for the time of read, write, and others in which voltage application is required.

It should be noted that the above-described effects are particularly advantageous in the case where the storage elements of the memory cells are variable resistive elements of, for example, a chalcogenide material.

The effects obtained by typical aspects of the present invention will be briefly described below. Particularly in a semiconductor device including a phase change material, reliability of read-out operations is improved, and stable generation of a reference voltage can be realized.

DESCRIPTIONS OF THE PREFERRED EMBODIMENTS

Figure 1:
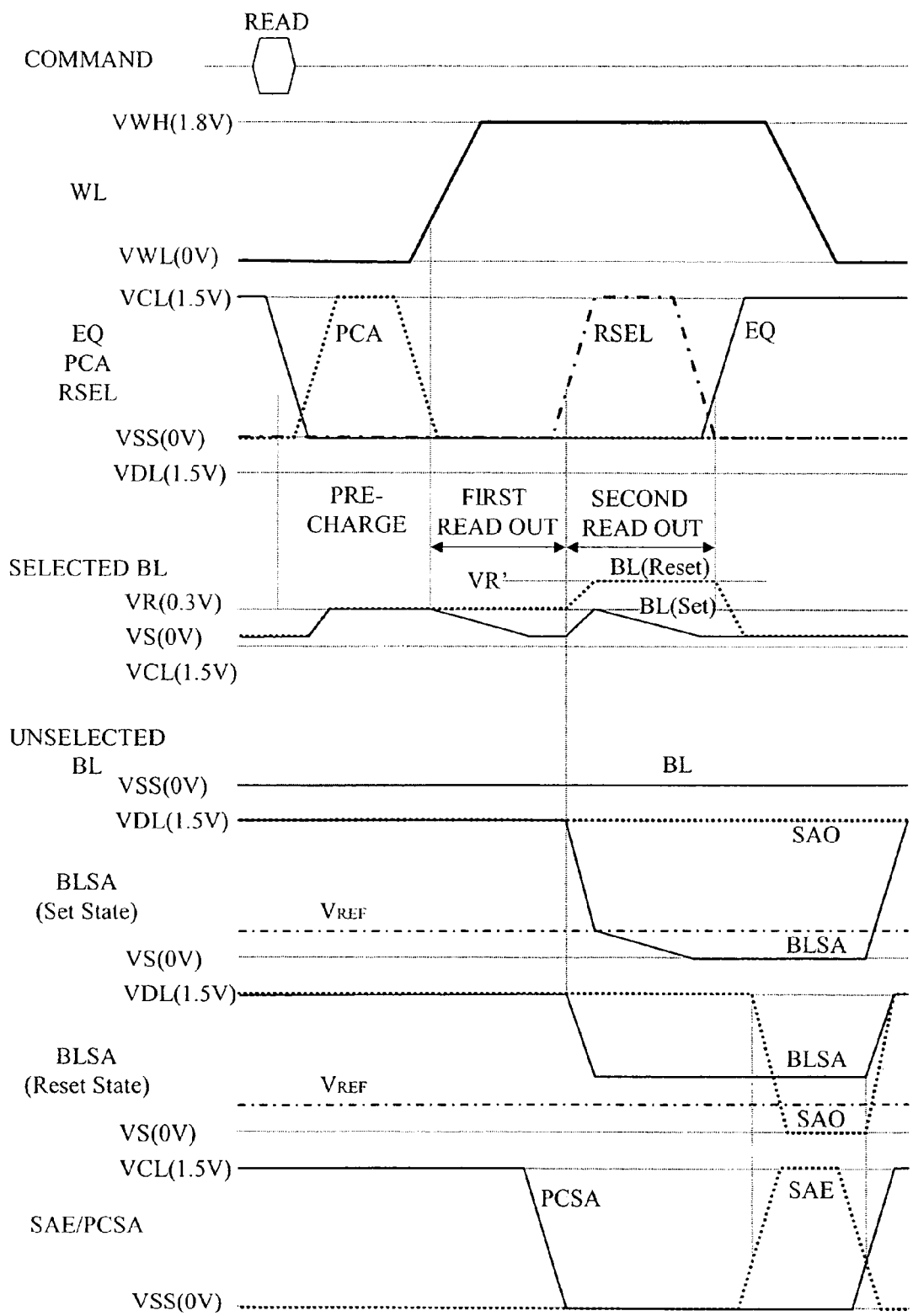
FIG. 1 is a waveform diagram showing an example of a read-out operation of a phase change memory which is included in a semiconductor device according to a first embodiment of the present invention.

Hereinafter, embodiments of the present invention will be described in detail with reference to the accompanying drawings. Note that components having the same function are denoted by the same reference symbols throughout the drawings for describing the embodiment, and the repetitive description thereof will be omitted. Although not particularly limited, the circuit elements constituting functional blocks in the embodiments below are formed on a semiconductor substrate such as single crystal silicon by integrated circuit technologies of, for example, publicly known CMOS (complementary MOS transistor).

In the embodiments, a MOS (Metal oxide Semiconductor) transistor is employed as an example of MISFET (Metal Insulator Semiconductor Field Effect Transistor). In the drawings, symbols of arrows are added to the bodies of PMOS transistors so as to discriminate them from NMOS transistors. Although the connection of the potential of the substrate of the MOS transistors is not particularly illustrated in the drawings, no particular limitation is imposed on the connection method as long as the MOS transistors can be normally operated.

Also, unless otherwise stated, a low level of a signal is defined as '0', and a high level thereof is defined as '1'. In the following description, a '0' state corresponds to a case where a storage element is in a crystalline state and has a low resistance value, and a '1' state corresponds to a case where the element is in an amorphous state and has a high resistance value. Alternatively, the '0' state may correspond to the case where the element is in the amorphous state and has a high resistance value, and the '1' state may correspond to the case where the element is in a crystalline state and has a low resistance value.

(First Embodiment)

FIG. 1 is a waveform diagram showing an example of a read-out operation of a phase change memory which is included in a semiconductor device according to a first embodiment of the present invention. This read-out operation is characterized in that a low voltage is applied (precharged) to a bit line at the beginning of the read-out operation, and after performing a read-out operation (first read out), charge is injected into the read bit line by sharing the charge with a sense amplifier so as to perform a read-out operation again (second read out).

Figure 2:
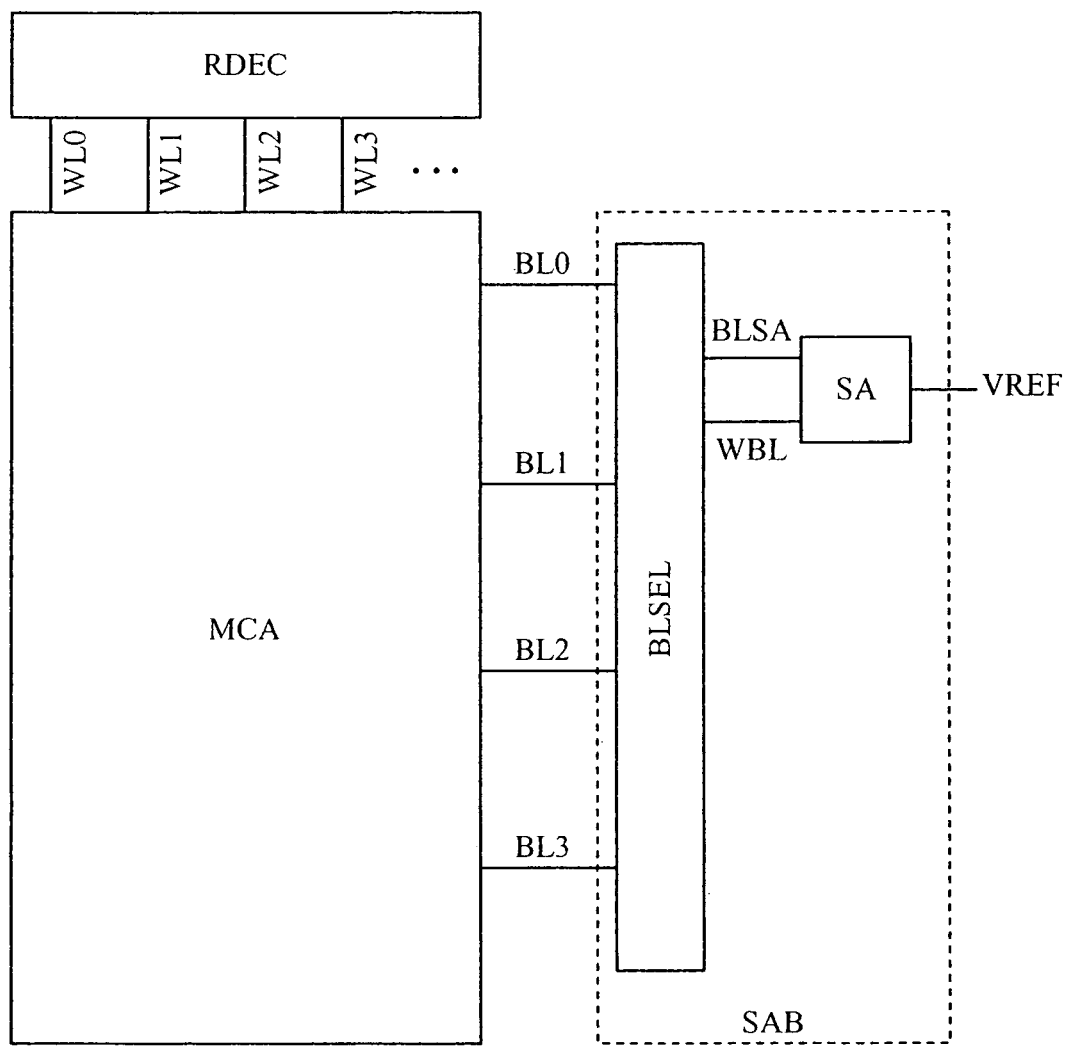
FIG. 2 is a block diagram showing a configuration example of a main part of the phase change memory which is included in the semiconductor device according to the first embodiment of the present invention.

Before describing details of the operation, circuit configurations for realizing the present read-out operation will be described below. FIG. 2 is a block diagram showing a configuration example of a main part of the phase change memory which is included in the semiconductor device according to the first embodiment of the present invention. The configuration example shown in FIG. 2 is formed on a semiconductor substrate and includes a memory cell array MCA, a sense amplifier block SAB, and a row decoder RDEC as parts of the circuit thereof.

In this configuration example, in the sense amplifier block SAB, one line selected from four bit lines BL0, BL1, BL2, and BL3 by a bit line selection circuit BLSEL is connected to a sense amplifier circuit SA. The bit line selection circuit BLSEL selects one line from the four bit lines in accordance with an inputted address (not shown) and connects the selected bit line to a read bit line BLSA in a read-out operation and connects the line to a write bit line WBL in a write operation.

The sense amplifier circuit SA is a circuit which performs determination of '1'/'0' by comparing a minute signal read out to the bit line of the array with a reference level VREF, and outputs data to outside the array via a sense amplifier output node SAO (not shown in FIG. 2) In addition, in the sense amplifier circuit SA, a write circuit for writing data to the memory cells in accordance with the write data from outside by utilizing the write bit line is also disposed. Specific circuit configuration examples thereof will be described later.

Figure 21:
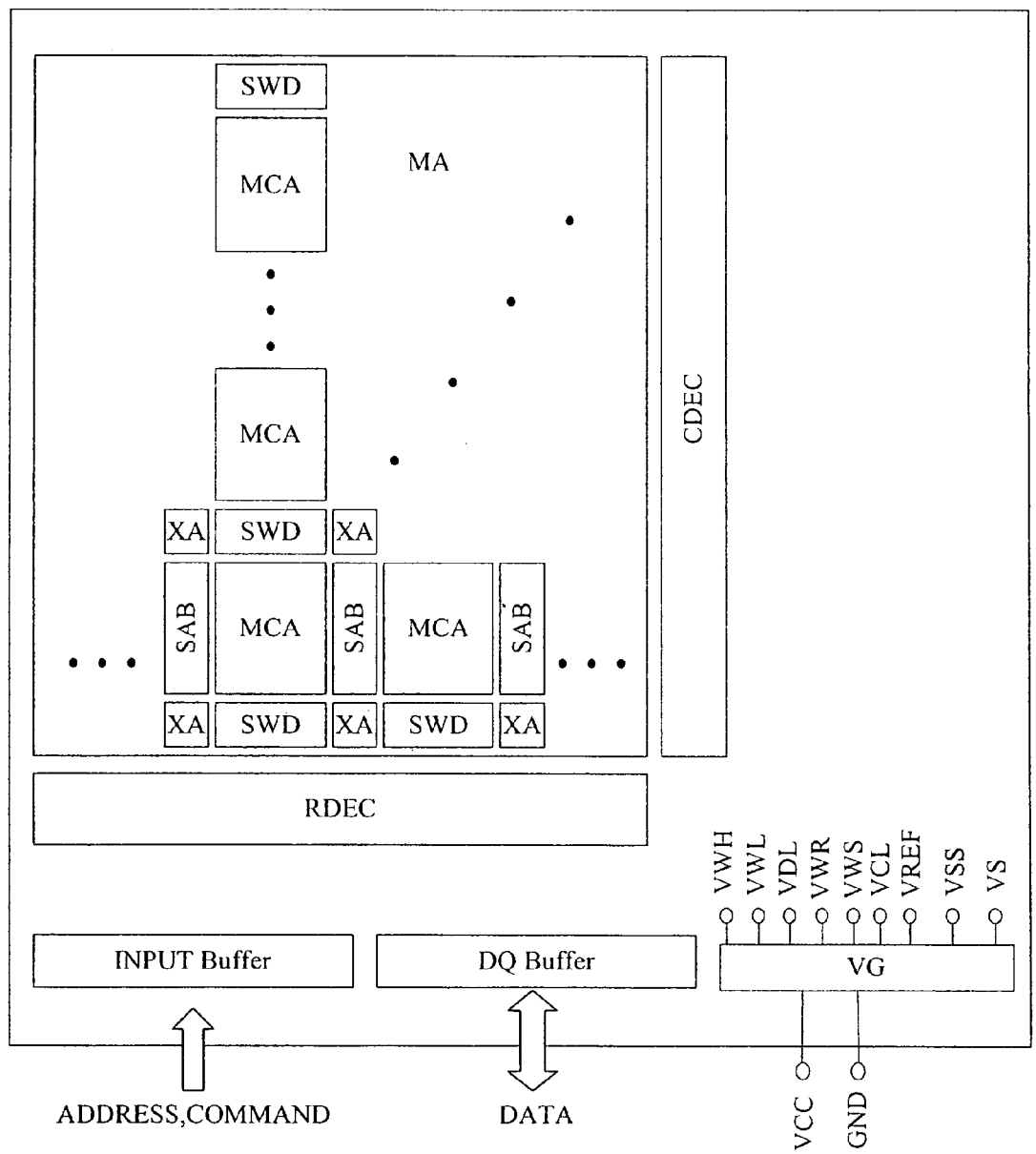
FIG. 21 is a block diagram showing an example of the entire configuration of the phase change memory including the configuration of FIG. 2.

The configuration example shown in FIG. 2 shows a main part in a chip such as that shown in FIG. 21. FIG. 21 is a block diagram showing an example of the entire configuration of the phase change memory including the configuration of FIG. 2. On the chip of the phase change memory shown in FIG. 21, for example, a memory array MA, the row decoder RDEC and a column decoder CDEC which are adjacent to the array, a power supply circuit VG, an input buffer (INPUT Buffer) for receiving commands and addresses from outside, and an input/output buffer (DQ Buffer) for inputting and outputting data from or to outside are disposed. The power supply circuit VG generates an internal voltage from an external power supply VCC. The reference level VREF of the bit line is also generated here.

The memory array MA is divided into a plurality of the memory cell arrays MCA, and sub word drivers SWD, the sense amplifier blocks SAB, and cross areas XA are included between the memory cell arrays MCA. Although the memory array MA has a multi-divided configuration here, the multi-divided configuration is not always required. The cross areas XA are the parts where the sense amplifier blocks SAB and the sub word drivers SWD intersect, and circuits for driving the control signals of the sense amplifier blocks and the sub word drivers are mainly disposed.

The configuration example in FIG. 2 shows a part of one memory cell array MCA, a part of one sense amplifier block SAB, and a part of a row decoder RDEC in such a chip.

Figure 3:
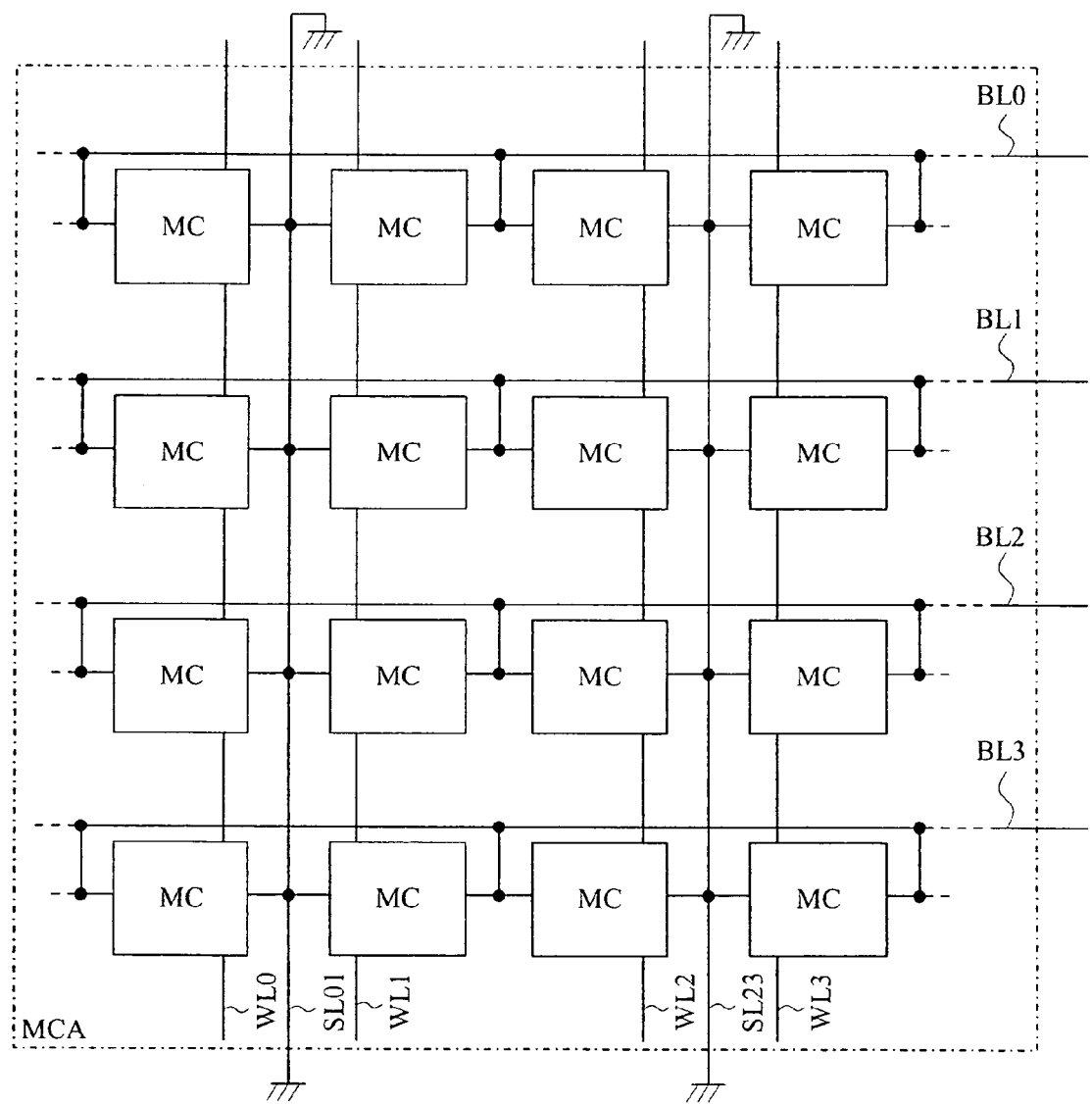
FIG. 3 is a circuit diagram showing an example of the configuration of the memory cell array MCA in the configuration example of FIG. 2.

FIG. 3 is a circuit diagram showing an example of the configuration of the memory cell array MCA of the configuration example of FIG. 2. The memory cell array MCA shown in FIG. 3 is comprised of word lines WL0, WL1, WL2, WL3 . . . , the bit lines BL0, BL1, BL2, and BL3, and memory cells MC which are disposed at desired intersecting points thereof, respectively. Also, source lines SL01, SL23 . . . are also provided, and these source lines are connected to control lines which are controlled depending on the time of reading out, writing, and waiting or connected to a particular potential (for example, ground potential VSS). The source lines SL may be a common plate. Herein, the bit lines are also referred to as data lines.

Figure 4A:
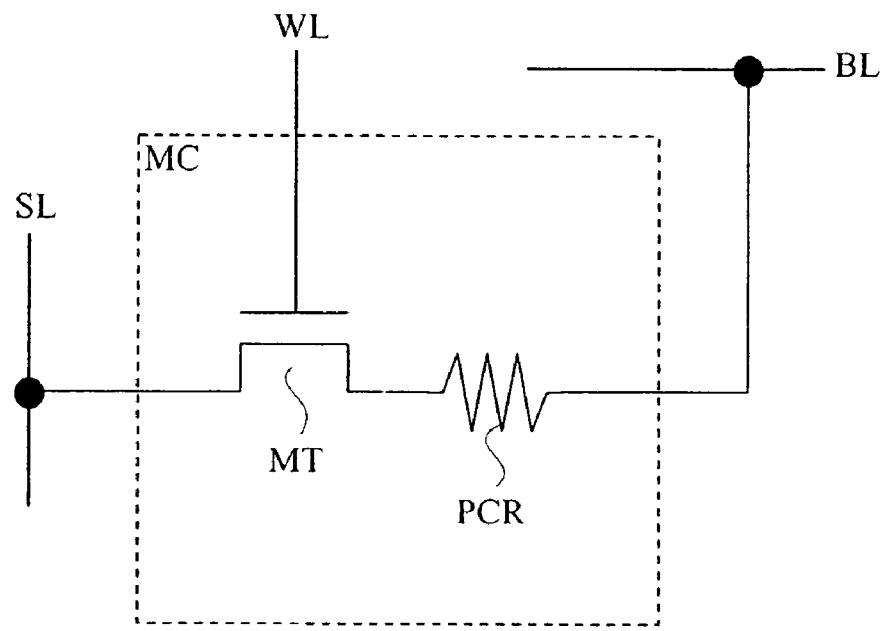
FIG. 4A is a circuit diagram showing an example of the configuration of each memory cell in the memory cell array of FIG. 3.
Figure 4B:
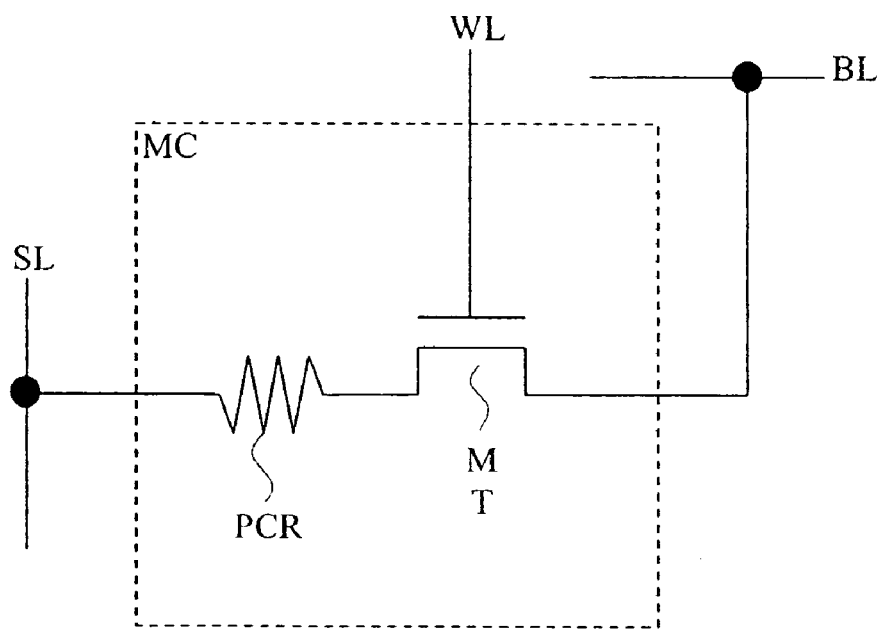
FIG. 4B is a circuit diagram showing another example of the configuration of each memory cell in the memory cell array of FIG. 3.

FIG. 4A and FIG. 4B are circuit diagrams showing examples of the configuration of each memory cell in the memory cell array of FIG. 3, wherein FIG. 4A and FIG. 4B show different configuration examples, respectively. Each memory cell MC is comprised of a storage element PCR and a memory cell transistor MT as shown in FIG. 4A or FIG. 4B. In FIG. 4A, one end of the storage element PCR is connected to the bit line BL and the other end thereof is connected to one of the source and drain of the memory cell transistor MT. The storage element PCR is made of a chalcogenide material containing, for example, germanium, antimony, tellurium and the like. The other of the source and drain of the memory cell transistor MT is connected to the source line SL, and the gate thereof is connected to the word line WL.

Also, as the configuration of the interior of the memory cell; the configuration in which the positions of the memory cell transistor MT and the storage element PCR of FIG. 4A are switched as shown in FIG. 4B is also preferable. This configuration is an advantageous in that the flow of an alternating current from the bit line BL to the storage element PCR can be prevented by setting the word line WL in an unselected state even when the bit line BL is driven in a write operation or the like.

In addition, an NMOS transistor is shown as the memory cell transistor MT herein. However, a PMOS transistor or a bipolar transistor is also available. However, in terms of large scale integration and process compatibility with peripheral circuits, a MOS transistor is desirable, and an NMOS transistor having a channel resistance in an on state smaller than that of a PMOS transistor is more preferable. Hereinafter, the configuration as shown in FIG. 4A is presupposed as the configuration of the memory cell, and operations and the like will be described based on the voltage relation of a case where the NMOS transistor is employed as the transistor.

Figure 5:
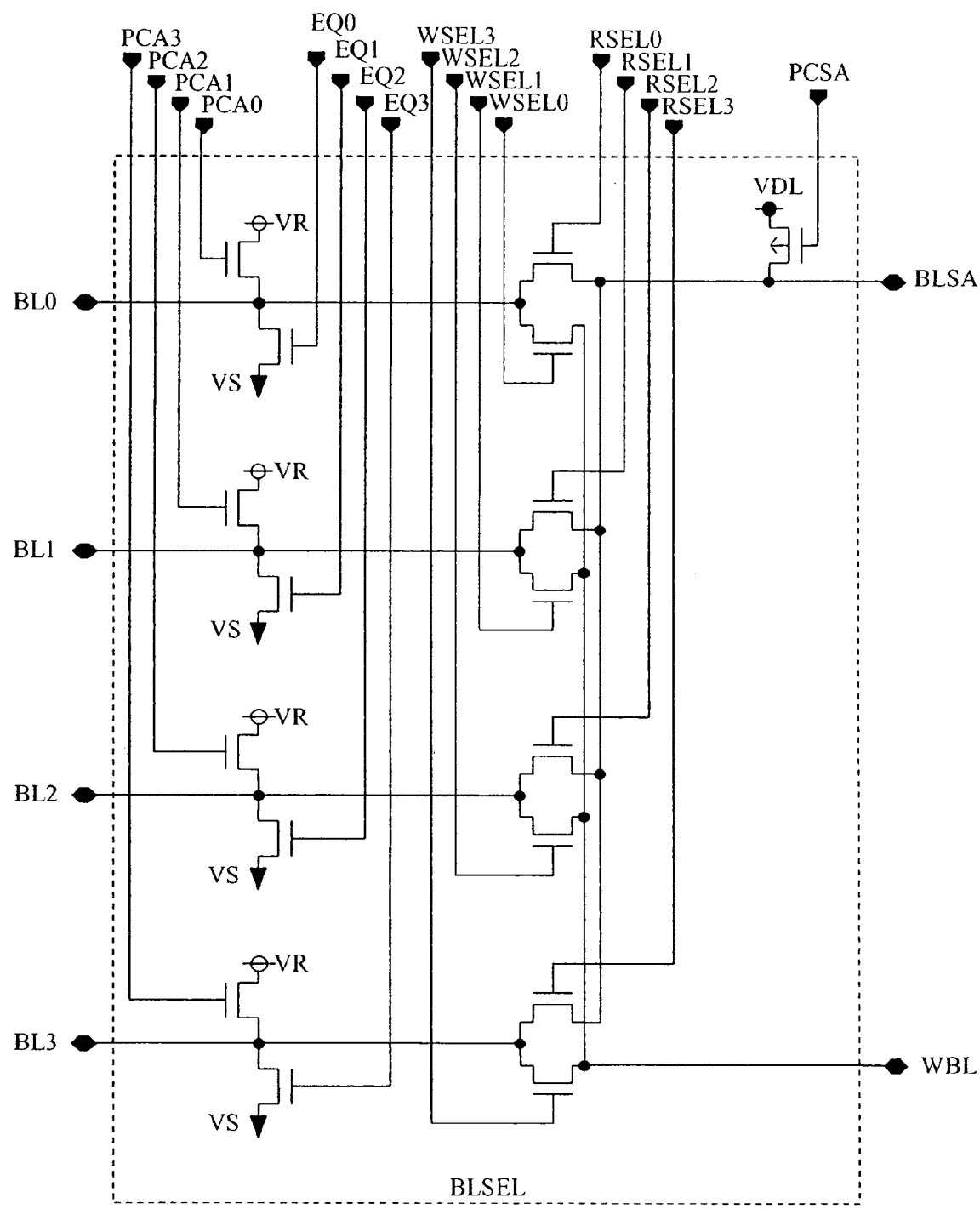
FIG. 5 is a circuit diagram showing an example of the configuration of the bit line selection circuit in the sense amplifier block in the configuration example of FIG. 2.

FIG. 5 is a circuit diagram showing an example of the configuration of the bit line selection circuit in the sense amplifier block in the configuration example of FIG. 2. The bit line selection circuit BLSEL is provided with read bit line selection signals RSEL0 to RSEL3 for selecting any of the bit lines BL0 to BL3 in the memory cell array MCA in accordance with an inputted address in a read-out operation, switches to which the read bit line selection signals RSEL0 to RSEL3 are inputted so as to connect any of the bit lines BL0 to BL3 to the read bit line BLSA in the sense amplifier, write bit line selection signals WSEL0 to WSEL3 for selecting any of the bit lines BL0 to BL3 in accordance with an inputted address in a write operation in the same manner as the read operation, and switches to which the write bit line selection signals WSEL0 to WSEL3 are inputted so as to connect any of the bit lines BL0 to BL3 to the write bit line WBL.

In addition to those described above, the bit line selection circuit BLSEL is further provided with switches which are controlled by bit line equalize signals EQ0 to EQ3 so as to set the bit lines BL0 to BL3 in a waiting period to a predetermined voltage level, for example, a source line potential VS of the memory cells MC, precharge switches which are controlled by bit line precharge signals PCA0 to PCA3 so as to set the bit lines BL0 to BL3 to an initial voltage level VR of the read out, and a switch which is controlled by a sense amplifier precharge signal PCSA so as to precharge the read bit line BLSA in the sense amplifier to a predetermined voltage level VDL of the read out.

Herein, all of the four bit line precharge signals PCA0 to PCA3 may be the same control signal (method in which the four bit lines are controlled by one bit line precharge signal at one time), or each of them may be an individual signal that is controlled by a corresponding address signal. Employment of the individual signals is advantageous in that power consumption can be reduced because waste charging and discharging of read-out/write unselected bit lines can be prevented. On the other hand, employment of the same signal is advantageous in that high-speed operations and reduction in area by virtue of reduced drive circuits of the control signals can be realized because control for each address is not required. Also, similar to the above-described precharge signal, the bit line equalize signals EQ0 to EQ3 may be the same control signal or may be individual control signals corresponding to respective address signals. Advantages of such cases are the same as the above-described case of the bit line precharge signals.

Figure 6:
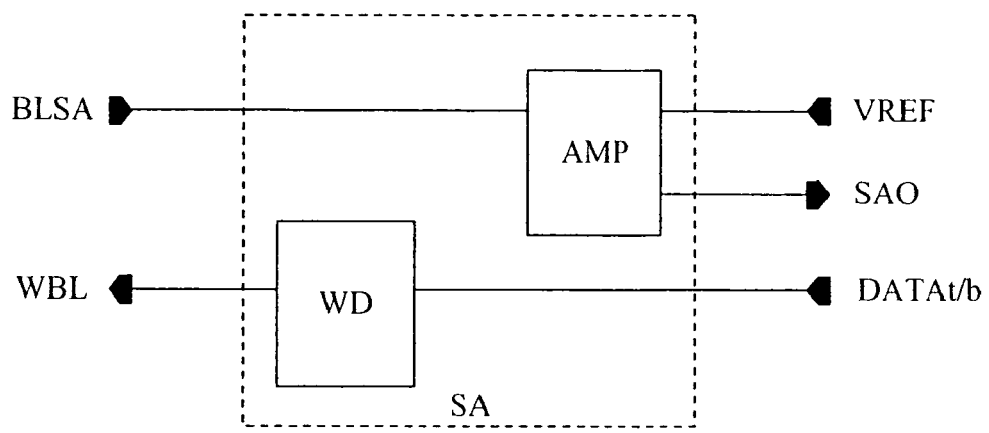
FIG. 6 is a configuration example of the sense amplifier circuit which is disposed in the sense amplifier block in the configuration example of FIG. 2.

FIG. 6 is a configuration example of the sense amplifier circuit which is disposed in the sense amplifier block of the configuration example of FIG. 2. The sense amplifier circuit SA is comprised of an amplifier circuit AMP for outputting the minute signal, which has been read out from the memory cell array MCA to the read bit line BLSA in the sense amplifier, to the sense amplifier output node SAO, and a write driver WD for writing write data from outside to the storage element PCR of the memory cell MC via the write bit line WBL.

Figure 7:
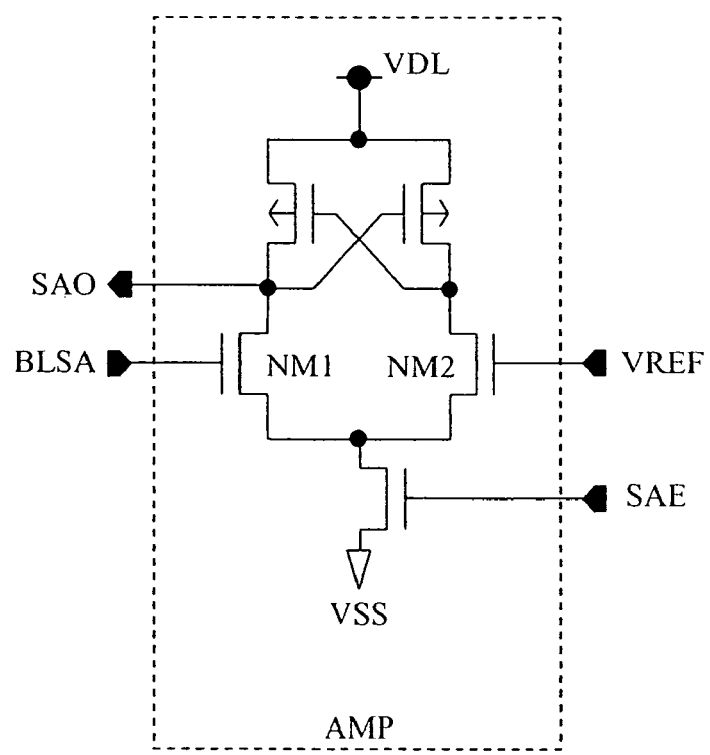
FIG. 7 is a circuit diagram showing an example of the configuration of an amplifier circuit in the sense amplifier circuit of FIG. 6.

FIG. 7 is a circuit diagram showing an example of the configuration of the amplifier circuit in the sense amplifier circuit of FIG. 6. The amplifier circuit AMP shown in FIG. 7 is a voltage-sensing type sense amplifier and is a gate-receiving amplifier circuit in which a pair of bit lines in the sense amplifier is connected to the respective gates of a pair of NMOS transistors NM1 and NM2. One of the pair of bit lines is the read bit line BLSA and the other one is the bit line to which the reference level VREF is always supplied. Cross-coupling type PMOS transistors serving as loads are connected to the drains of the NMOS transistors NM1 and NM2, respectively. The sources of the NMOS transistors NM1 and NM2, which are connected in common with each other, are connected to an amplifier circuit driving MOS transistor.

The amplifier circuit AMP is activated by a sense amplifier activation signal SAE which is a gate signal of the amplifier circuit driving MOS transistor. In this amplifier circuit AMP, when the read bit line BLSA in the sense amplifier has a potential lower than the reference level VREF, 'H' is outputted to the sense amplifier output node SAO, and when the read bit line BLSA has a potential higher than the reference level VREF, 'L' is output to the sense amplifier output node SAO. As long as similar functions are provided, the circuit configuration of the amplifier circuit AMP is not limited to this circuit configuration.

Figure 8A:
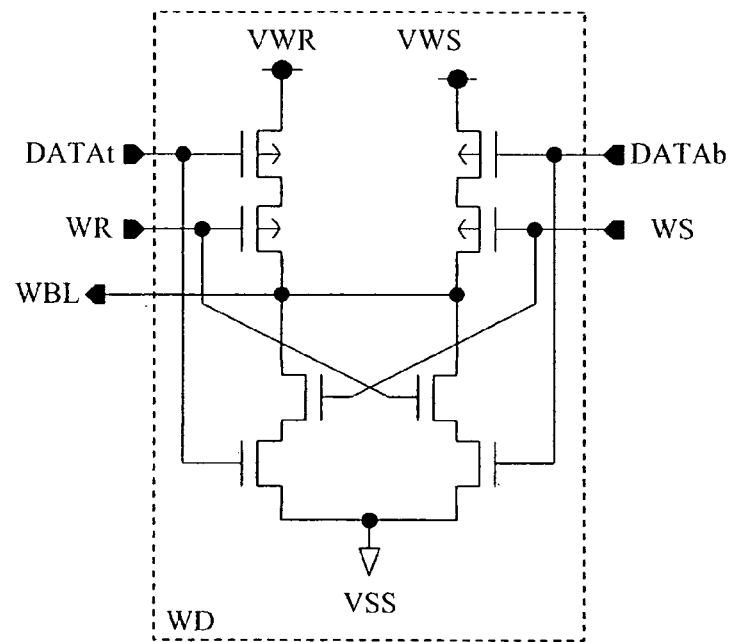
FIG. 8A is a circuit diagram showing an example of the configuration of a write driver in the sense amplifier circuit of FIG. 6.
Figure 8B:
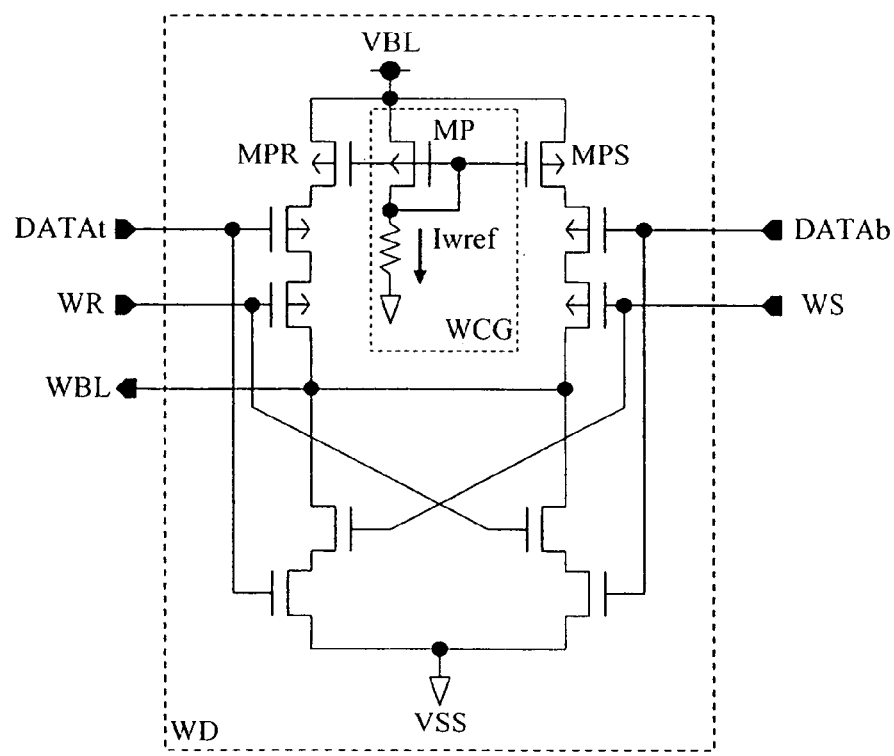
FIG. 8B is a circuit diagram showing another example of the configuration of a write driver in the sense amplifier circuit of FIG. 6.

FIG. 8A and FIG. 8B are circuit diagrams showing examples of the configuration of the write driver WD in the sense amplifier circuit of FIG. 6, wherein FIG. 8A and FIG. 8B show different configuration examples. In FIG. 8A, a method in which the write voltage is controlled is employed. More specifically, when complementary data is inputted to external input data (data bus) DATA t/b and a set enable signal WS and a reset enable signal WR transit from a high potential state to a low potential state, it is activated, and the write bit line WBL is driven to a high potential. At this time, when the external input data DATAt is in a low potential state and the external input data DATAb is in a high potential state, an operation of resetting the memory cell MC is performed, and a reset voltage VWR is applied to the write bit line WBL.

When the reset voltage VWR is applied to the write bit line WBL, any of the bit lines BL0, BL1, ... in the array is driven to the reset voltage VWR via the bit line selection circuit BLSEL, and a write current that is required for the reset operation is supplied to the storage element PCR of the memory cell MC. The period in which the write bit line WBL is being driven herein is defined by the period in which the reset enable signal WR is being driven to a low potential.

On the other hand, when the external input data DATAt is in a high potential state and the external input data DATAb is in a low potential state, an operation of setting the memory cell MC is performed, and a set voltage VWS is applied to the write bit line WBL. When the set voltage VWS is applied to the write bit line WBL, any of the bit lines BL0, BL1, ... in the array is driven to the set voltage VWS via the bit line selection circuit BLSEL, and a write current required for the set operation flows through the storage element PCR of the memory cell MC. The period in which the write bit line WBL is being driven is defined by the period in which the set enable signal WS is being driven to a low potential, and the period of the set operation is longer than the period of the reset operation. Thereafter, in any of the operations, when the set/reset enable signals WS/WR are in a high potential state, the write bit line WBL is driven to a low potential (for example, to the source line potential VS), and the write operation is terminated.

Different from FIG. 8A described above, in FIG. 8B, a method in which the write current is controlled by use of a current mirror circuit in accordance with write data is employed. In the write driver WD, a write reference current source WCG is disposed, in which reference current Iwref for generating the current required for set/reset operations is generated. In this method, the mirror ratio of the current mirror circuit is set by varying the size (gate length or gate width) of a transistor MPR or a transistor MPS constituting the current mirror circuit together with a transistor MP. By doing so, a current of a constant number of times the reference current Iwref flows in the respective write operations.

At this time, when the external input data DATAt is in a low potential state and the external input data DATAb is in a high potential state, an operation of resetting the memory cell MC is performed, and a reset current flows through the write bit line WBL. The reset current is transferred to any of the bit lines BL0, BL1, ... in the array via the write bit line WBL and the bit line selection circuit BLSEL, and flows through the storage element PCR of the memory cell MC. The period in which the write current is flowing through the write bit line WBL is defined by the period in which the reset enable signal WR is being driven to a low potential.

On the other hand, when the external input data DATAt is in a high potential state and the external input data DATAb is in a low potential state, an operation of setting the memory cell MC is performed, and a set current flows through the write bit line WBL. The set current is transferred to any of the bit lines BL0, BL1, ... in the array via the write bit line WBL and the bit line selection circuit BLSEL, and flows through the storage element PCR of the memory cell MC. The period in which the write current is flowing through the write bit line WBL is defined by the period in which the set enable signal WS is being driven to a low potential, and the period of the set operation is longer than the period of the reset operation. Thereafter, in any of the operations, when the set/reset enable signals WS/WR are in a high potential state, the write bit line WBL is driven to a low potential (for example, to the source line potential VS), and the write operation is terminated.

The read-out operation of the phase change memory having such a configuration will be described in detail with reference to FIG. 1 described above. An operation of reading out the bit line BL0 among the bit lines BL0, BL1, BL2, and BL3 in the memory cell array MCA will be described here as an example.

When a read command READ is inputted from outside, in the memory cell array MCA corresponding to an address which is also inputted at the same time, the bit line equalize signal EQ0 for setting the bit line BL and the source line SL to an equal potential during a waiting period is inactivated by making a transition from a high potential state to a low potential state, and the bit line BL0 in the array attains a floating state. The unselected bit lines BL1, BL2, and BL3 maintain the potential VS of the source lines SL by maintaining the corresponding bit line equalize signals EQ1, EQ2, and EQ3 to a high potential, such that unnecessary voltage application with respect to the storage elements PCR in the memory cells MC is prevented so as to prevent erroneous rewriting.

Subsequently, the bit line precharge signal PCA0 is activated by making a transition from a low potential state to a high potential state, and the selected bit line BL0 is set to a read bit line level VR. The read bit line level VR is a voltage that is sufficiently low such that no rewrite operation is performed even when it is applied to the storage element PCR. At this time, the unselected bit lines BL1, BL2, and BL3 maintain a waiting-period bit line level (source line potential VS).

After the bit line BL0 is set to the read bit line level VR, the bit line precharge signal PCA0 is inactivated. Then, the word line WL corresponding to the address which has been inputted at the same time as the read command READ is activated by making a transition from a low potential state VWL to a high potential state VWH. When the word line WL is activated, the memory cell transistor MT of the memory cell MC is driven, and the read bit line level VR is applied to the storage element PCR.

At this time, when the storage element PCR is in a high resistance state, that is, when it is in an amorphous (non-crystalline) state in the case where the phase change element is used, the current that flows through the element is small.

Therefore, the bit-line potential is little varied from the precharged read bit line level VR. In FIG. 1, it is represented by the waveform of the bit line BL0 (Reset) in the period from precharge to a first read out. Meanwhile, when the storage element PCR is in a low resistance state, that is, when it is in a crystalline state in the case where the phase change element is used, the current that flows through the element increases, and the bit-line potential transits from the read bit line level VR to the source-line potential VS. In FIG. 1, it is represented by the waveform of the bit line BL0 (Set) in the period described above.

After the word line WL is activated and a predetermined period elapses, the read bit line selection signal RSEL0 for connecting the bit line BL0 of the array with the sense amplifier is activated. Accordingly, the period of a second read out in FIG. 1 is started. At this time, the read bit line BLSA in the sense amplifier is precharged to a potential, for example, the array voltage VDL which is higher than that of the bit line BL0 of the array. When the read bit line selection signal RSEL0 is activated in this state, charge sharing occurs between the read bit line BLSA in the sense amplifier and the bit line BL0 in the array.

When the storage element PCR of the selected memory cell is in a low resistance state, the bit line level before charge sharing is the potential equal to the source-line potential VS, and when it is in a high resistance state, the level is the read bit line level VR. When charge sharing occurs at this point, the level becomes VDL×CSA/(CSA+CB) in the low resistance state and becomes VR'=(VDL×CSA+VR×CB)/(CSA+CB) in the high resistance state. Herein, CB denotes bit line capacity in the array, and CSA denotes capacity of the read bit line BLSA in the sense amplifier.

During this period, since the word line WL is always in an activated state, when the storage element PCR is in the low resistance state, the charge of the bit line BL0 is continuously drawn to the source line SL. Meanwhile, in the high resistance state, the level of the bit line BL0 increases. However, the level after the charge sharing is little varied and maintained because the current that flows through the storage element PCR is small. According to this read-out operation, by appropriately setting the reference level VREF, the read bit line BLSA in the sense amplifier is on the higher potential side than the reference level in the high resistance state (Reset), and is on the lower potential side than the reference level VREF in the low resistance state (Set).

Then, after time elapses until the bit line which reads out the storage element PCR in the low resistance state attains a potential approximately equal to the source potential, the read bit line selection signal RSEL0 attains an inactivated state, thereby separating the bit line BL in the array from the read bit line BLSA in the sense amplifier. Approximately at the same time with this, the equalize signal EQ for setting the bit line BL in the array to a waiting-period voltage attains an activated state, and the bit line BL in the array is set to the potential that is equal to the source-line potential VS. Then, the period of the second read out in FIG. 1 is completed. As described above, by setting the bit line BL to the potential equal to the source-line potential VS, the voltage applied to both ends of the storage element PCR becomes 0 V, and thus, no current flows through the element. Therefore, heat generation can be prevented, and data destruction can be prevented.

Meanwhile, in the sense amplifier, when the amplifier is activated by the sense amplifier activation signal SAE, the read bit line BLSA in the sense amplifier is compared with the reference level VREF, and the data corresponding to the stored content is outputted to the sense amplifier output node SAO. In this case, a high potential is outputted in the low resistance state, and a low potential is outputted in the high resistance state. Then, the word line WL transits to an inactivated state, and the read bit line BLSA in the sense amplifier is precharged to the array voltage VDL again by the sense amplifier precharge switch in the bit line selection circuit BLSEL.

When the above-described read-out method is employed, the read voltage applied to the bit line can be reduced, and the period in which a high read voltage is applied to the bit line can be shortened. Therefore, heat generation during a read-out period can be suppressed and destructive read operation such as erroneous writing can be prevented. In addition, thermal disturbance due to the read current can be prevented, Consequently, a highly reliable and stable read-out operation can be performed.

More specifically, if the present read-out method is not employed, in order to obtain a read-out signal having the amplitude of the voltage VR', for example, the method is employed in which a read out is performed only by applying a voltage almost equal to the voltage VR' to the bit line for the period in which the voltage is discharged in FIG. 1. In comparison with this, when the present method is employed, at most voltage about the read bit line level VR is applied in the case of the low resistance state (BL (set)), and also, the period in which the voltage VR' is applied (period of the second read out) can be shortened even in the case of the high resistance state (BL (Reset)). For example, when the voltage discharged in the low resistance state (BL (set)) is about half of the voltage VR' as shown in the period of the second read out of FIG. 1, the period of the second read out is also correspondingly reduced to about half.

Figure 9:
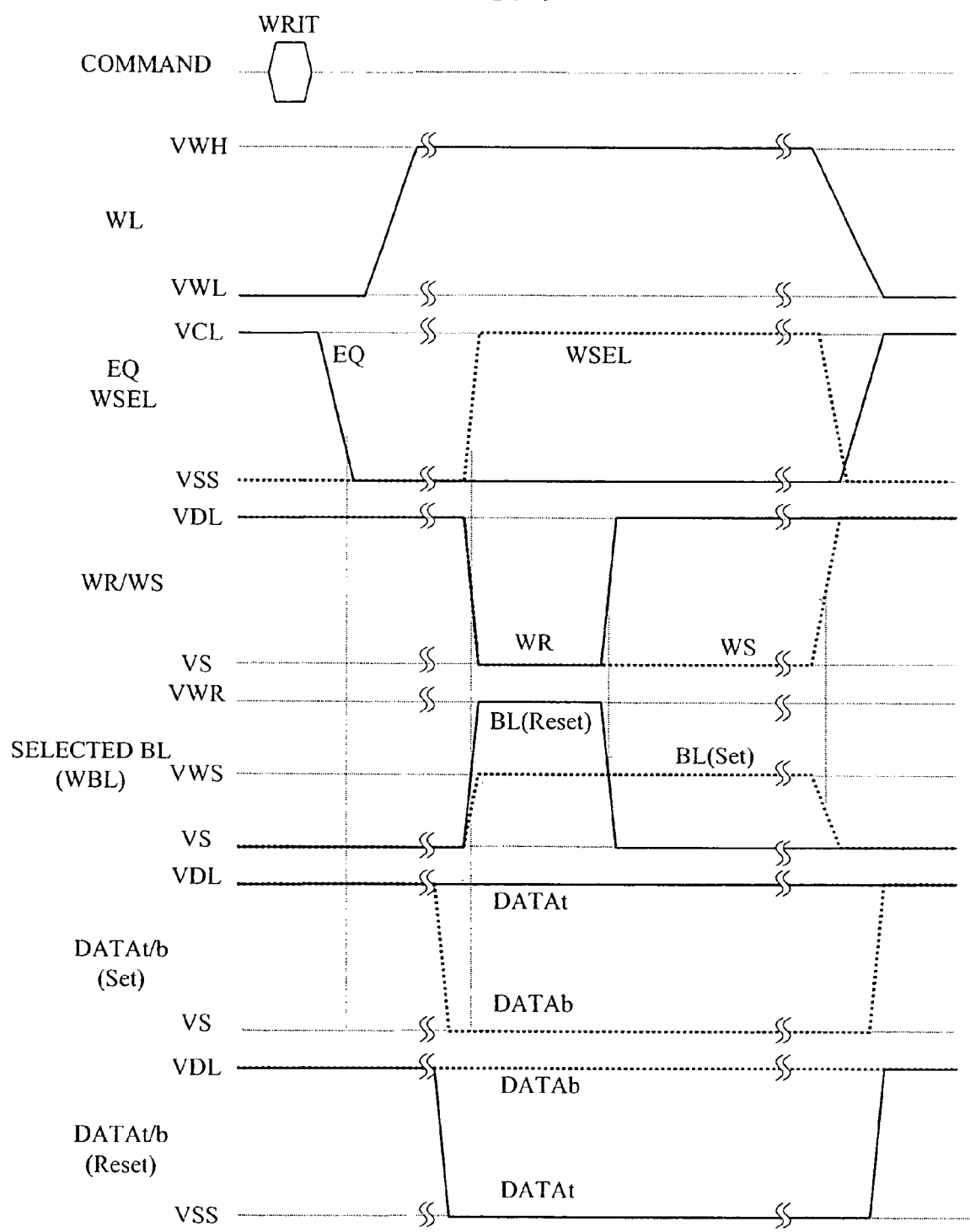
FIG. 9 is a waveform diagram showing an example of a write operation of the phase change memory which is included in the semiconductor device according to the first embodiment of the present invention.

Next, the write operation will be described. FIG. 9 is a waveform diagram showing an example of a write operation of the phase change memory included in the semiconductor device according to the first embodiment of the present invention. In this case, the description will be made based on the assumption that the writing is performed to the memory cell MC on the bit line BL1.

When a write command WRIT is inputted from outside, the equalize signal EQ1 of the bit line BL1 corresponding to the address which has been inputted at the same time as the command transits to an inactivated state. At this point, when a read out is to be performed once, the operation similar to the above-described read-out operation is performed. Then, in a state where the selected bit line and unselected bit lines are precharged to the source-line potential VS, the word line WL is activated. Then, write data inputted from outside is transferred through the data buses DATA t/b.

The write driver WD in the sense amplifier circuit SA drives the write bit line WBL in accordance with the potentials of the data buses DATA t/b. When DATAt is in a high potential state and DATAb is in a low potential state, the set write voltage VWS is supplied to the bit line BL1 during the set time determined by the set enable signal WS. Meanwhile, when the data bus DATAt is in a low potential state and the data bus DATAb is in a high potential state, the reset write voltage VWR is supplied to the bit line BL1 during the reset time determined by the reset enable signal WR. The reset time is usually shorter than the set time and is, for example, about 10 ns to 100 ns. On the other hand, the set time is usually about 50 ns to 1 us.

Thereafter, when the reset enable signal WR and the set enable signal WS transit to an inactivated state (high potential state in this case), the write operation is terminated. Then, the bit line BL of the array is fixed to the source-line potential VS again by the bit-line equalize signal EQ. When successive write operations are not performed, at this point, the activated word line WL transits to an unselected state, thereby attaining a waiting state. The write operation may be an operation in which writing is performed only to the selected memory cell after once performing a read-out operation, or may be an operation in which writing is performed to the selected memory cell without any read-out operation.

Next, other configuration examples of above-described circuit blocks will be described.

Figure 10:
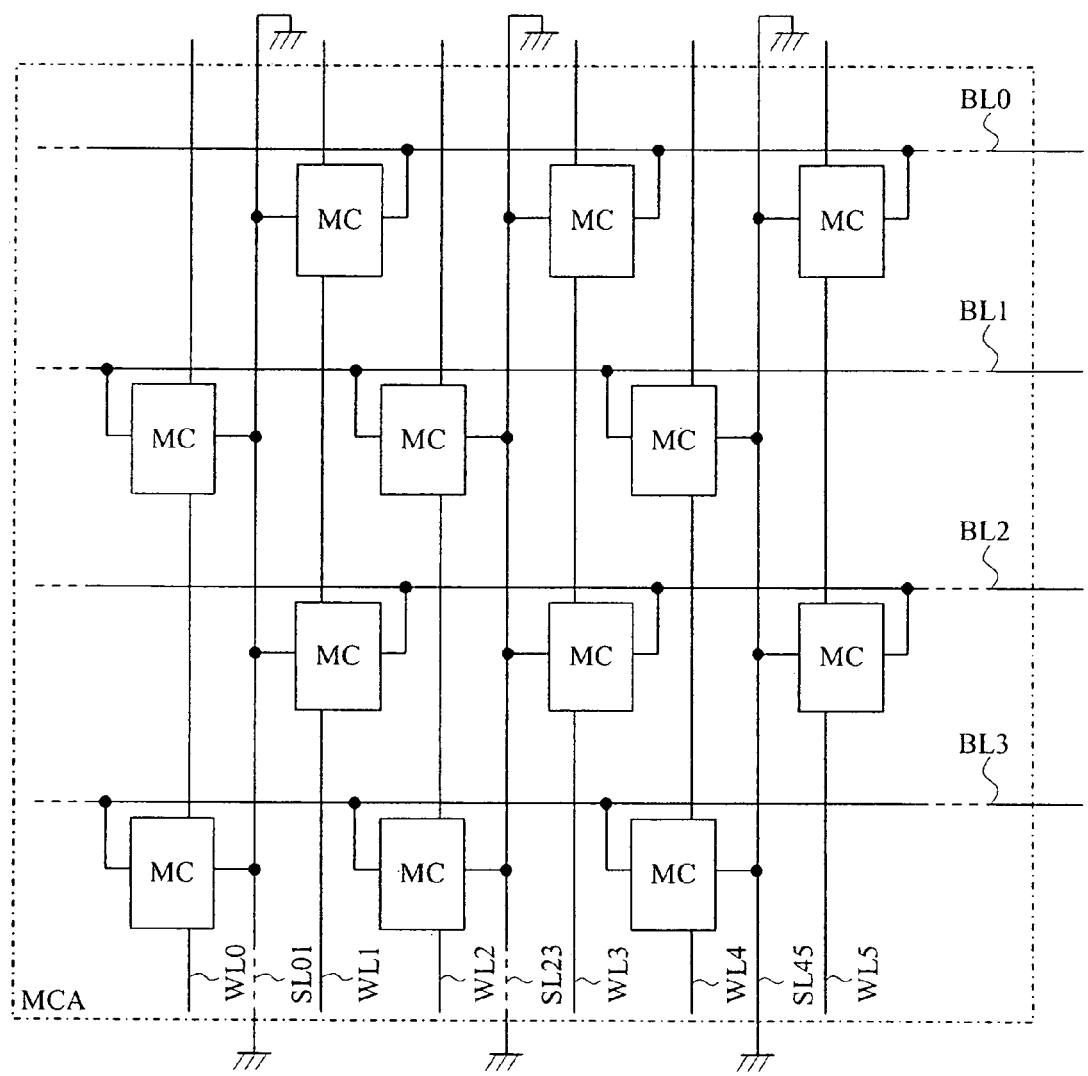
FIG. 10 is a circuit diagram showing a configuration example of the memory cell array different from FIG. 3 in the configuration example of FIG. 2.

FIG. 10 is a circuit diagram showing a configuration example of the memory cell array different from that in FIG. 3 in the configuration example of FIG. 2. In FIG. 3, the memory cells MC are disposed at all of the intersecting points of the word lines WL and the bit lines BL. On the other hand, in the present configuration example, they are disposed at half of the intersecting points, and the memory cell MC is disposed at only one intersecting point of two adjacent intersecting points. In other words, this configuration is characterized in that, on one bit line BL, the memory cell MC is disposed on every other intersecting word line, and similarly, on one word line WL, the memory cell MC is disposed at every other intersecting bit line. Similar to the above-described case of FIG. 3, any of the configurations of FIG. 4A and FIG. 4B can be applied to the memory cell MC in the present memory cell array MCA. Such a layout has advantages that the area of the memory cell transistors can be increased, and large current driving force can be obtained.

Figure 11:
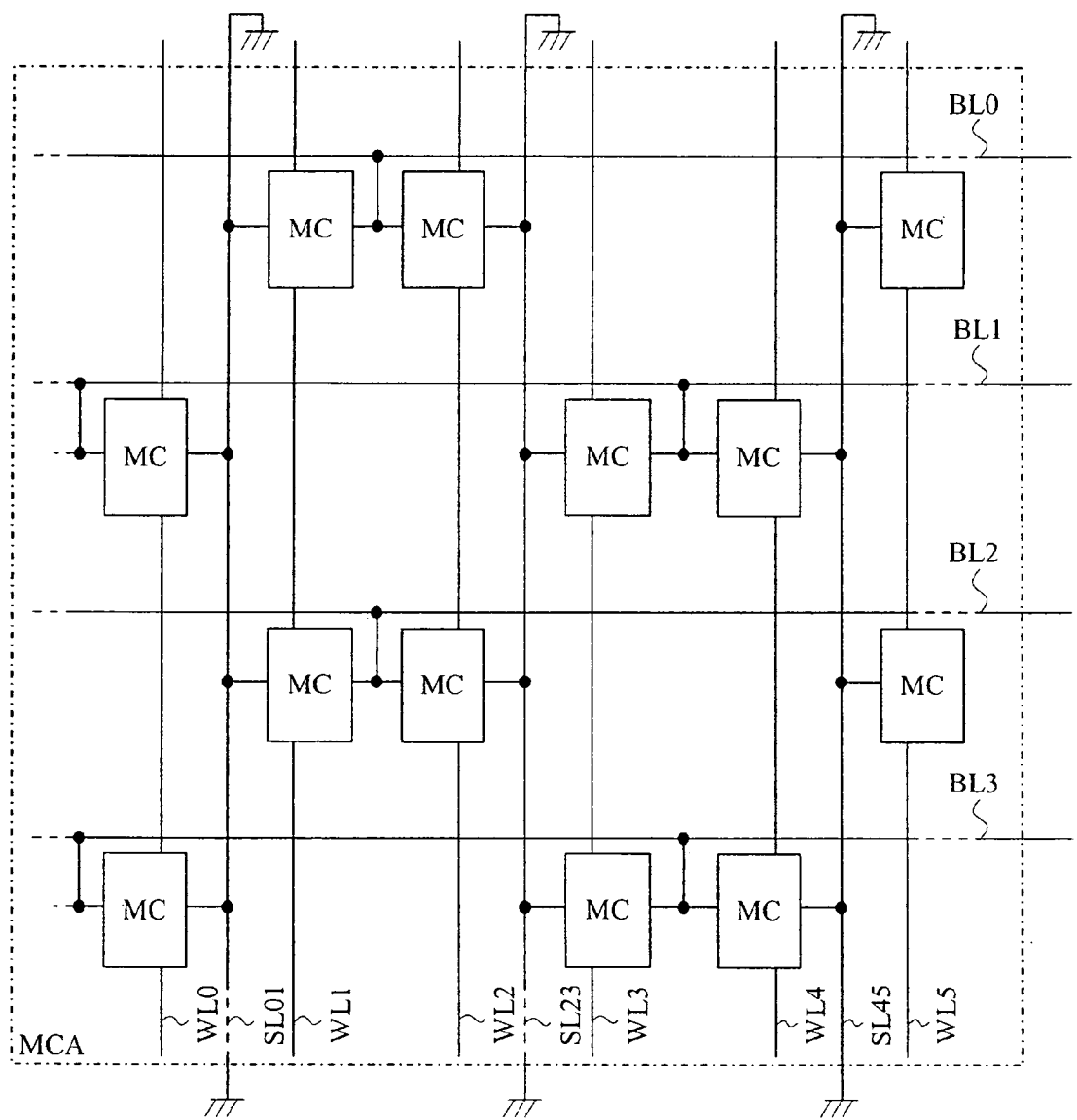
FIG. 11 is a circuit diagram showing another configuration example of the memory cell array different from FIG. 3 in the configuration example of FIG. 2.

FIG. 11 is a circuit diagram showing another configuration example of the memory cell array different from that in FIG. 3 in the configuration example of FIG. 2. Also in the present configuration example, the memory cells MC are disposed only at half of the intersecting points of the word lines WL and the bit lines BL similar to that described in FIG. 10. In this configuration, adjacent two memory cells share a bit line contact, and on one bit line, among the intersecting points with the intersecting word lines, each two intersecting points having memory cells and each two intersecting points having no memory cells are alternately disposed. Meanwhile, on the word line WL, among the intersecting points with the intersecting bit lines BL, the memory cell MC is disposed at every another bit line.

Similar to the above-described case of FIG. 3, any of the configurations of FIG. 4A and FIG. 4B can be applied to the memory cell MC in the present memory cell array MCA. In particular, the configuration in FIG. 4B in which a diffusion layer of the transistor can be shared is more preferable. In such a layout, when the memory cells MC of FIG. 4B are employed, the bit line contact can be shared and the memory cell areas can be reduced, and therefore, large scale integration can be realized.

Figure 12:
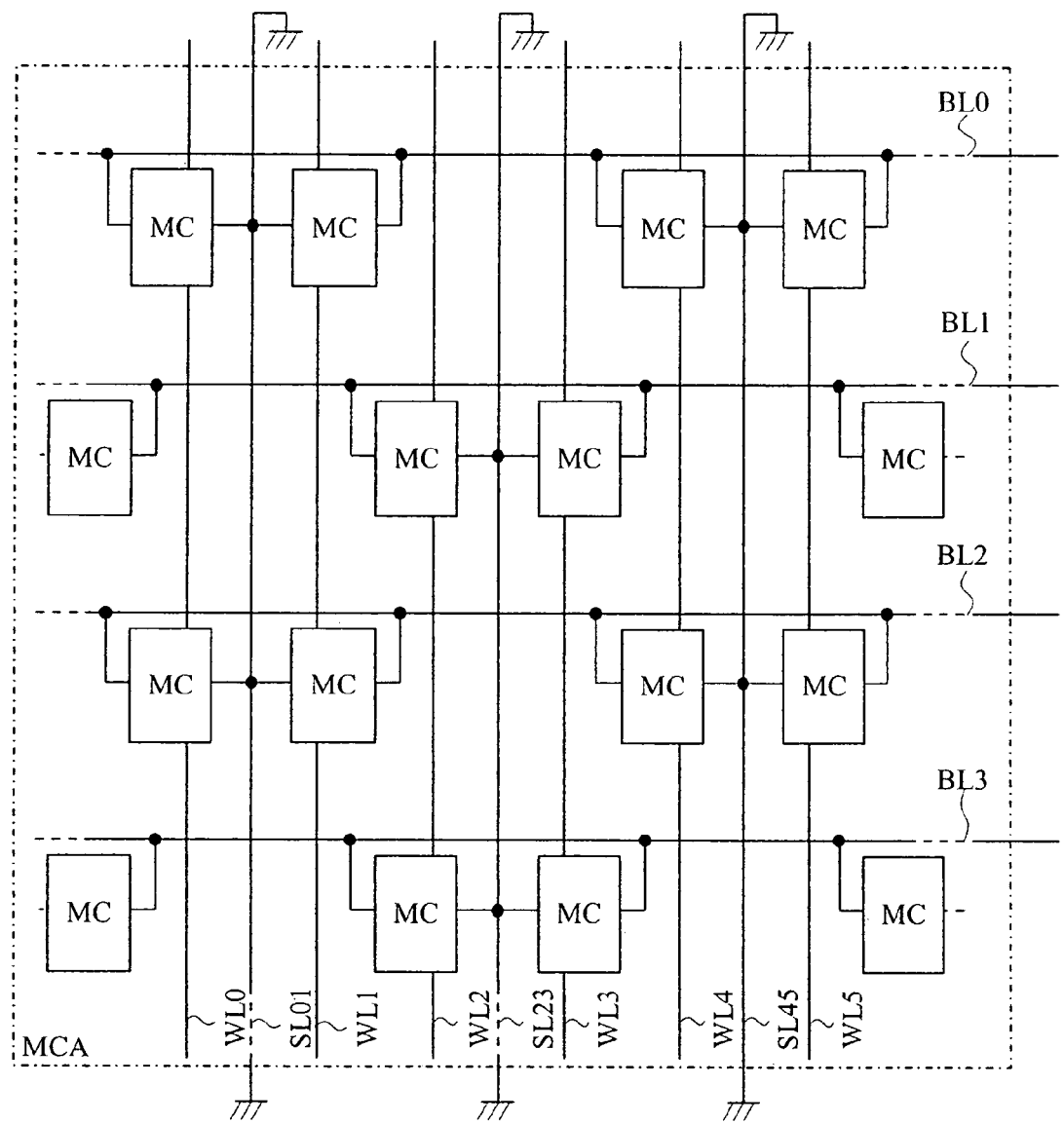
FIG. 12 is a circuit diagram showing another configuration example of the memory cell array different from FIG. 3 in the configuration example of FIG. 2.

FIG. 12 is a circuit diagram showing another configuration example of the memory cell array different from that in FIG. 3 in the configuration example of FIG. 2. Also in the present configuration example, the memory cells MC are disposed only at half of the intersecting points of the word lines WL and the bit lines BL similar to those described in FIG. 10 and FIG. 11. However, in the present configuration, different from FIG. 11, source-line contact is shared by adjacent memory cells MC. On one bit line, among the intersecting points with the intersecting word lines WL, each two intersecting points having the memory cells MC and each two intersecting points having no memory cells are alternately disposed. Meanwhile, on the word line WL, among the intersecting points with the intersecting bit lines BL, the memory cell MC is disposed on every other bit line.

Similar to the above-described case of FIG. 3, any of the configurations of FIG. 4A and FIG. 4B can be applied to the memory cell MC in the present memory cell array MCA. In particular, the configuration in FIG. 4A in which a diffusion layer of the transistor can be shared is more preferable. In such a layout, when the memory cells MC of FIG. 4A are employed, the source line contact can be shared and the memory cell areas can be reduced, and therefore, large scale integration can be realized.

Figure 13:
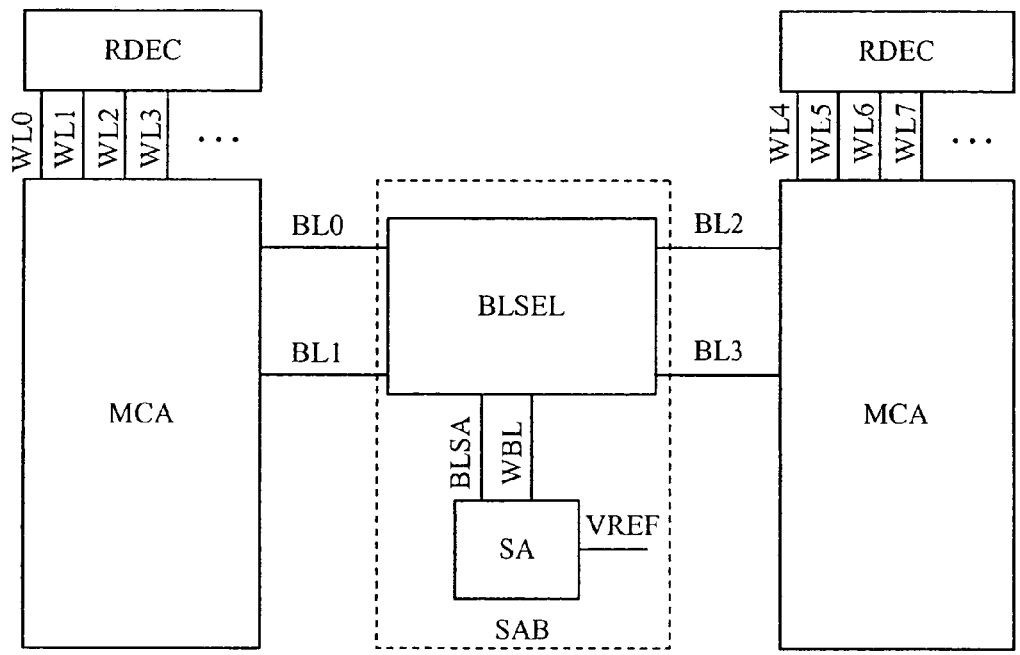
FIG. 13 is a block diagram showing a configuration example of a main part of the phase change memory different from FIG. 2 in the semiconductor device according to the first embodiment of the present invention.

FIG. 13 is a block diagram showing a configuration example of a main part of the phase change memory different from that in FIG. 2 in the semiconductor device according to the first embodiment of the present invention. In FIG. 2, the memory cell array MCA is disposed on one side of the sense amplifier block SAB. Meanwhile, in FIG. 13, the memory cell arrays MCA are disposed on both sides of the sense amplifier block SAB. Furthermore, the bit lines BL0 and BL1 of the memory cell array MCA that is disposed on the left side of the sense amplifier block SAB and the bit lines BL2 and BL3 of the memory cell array MCA that is disposed on the right side of the sense amplifier block SAB are connected to the bit line selection circuit BLSEL in the common sense amplifier block SAB. Also, the bit line selection circuit BLSEL is connected to the sense amplifier circuit SA via the read bit line BLSA and the write bit line WBL.

That is, the present configuration example has a common sense amplifier configuration in which, when either one of the left and right memory cells MC is activated, the sense amplifier circuit SA of the sense amplifier block SAB which is disposed between the two memory cell arrays MCA is activated. When such a common sense amplifier configuration is employed, the part of the memory array MA can be readily composed by a multi-divided array on the chip as shown in FIG. 21. In FIG. 21, as described above, one memory array MA is divided into the plurality of memory cell arrays MCA by the sense amplifier blocks SAB and sub word drivers SWD. The configurations of the bit line selection circuit BLSEL and the sense amplifier circuit SA are similar to those described above.

Figure 14:
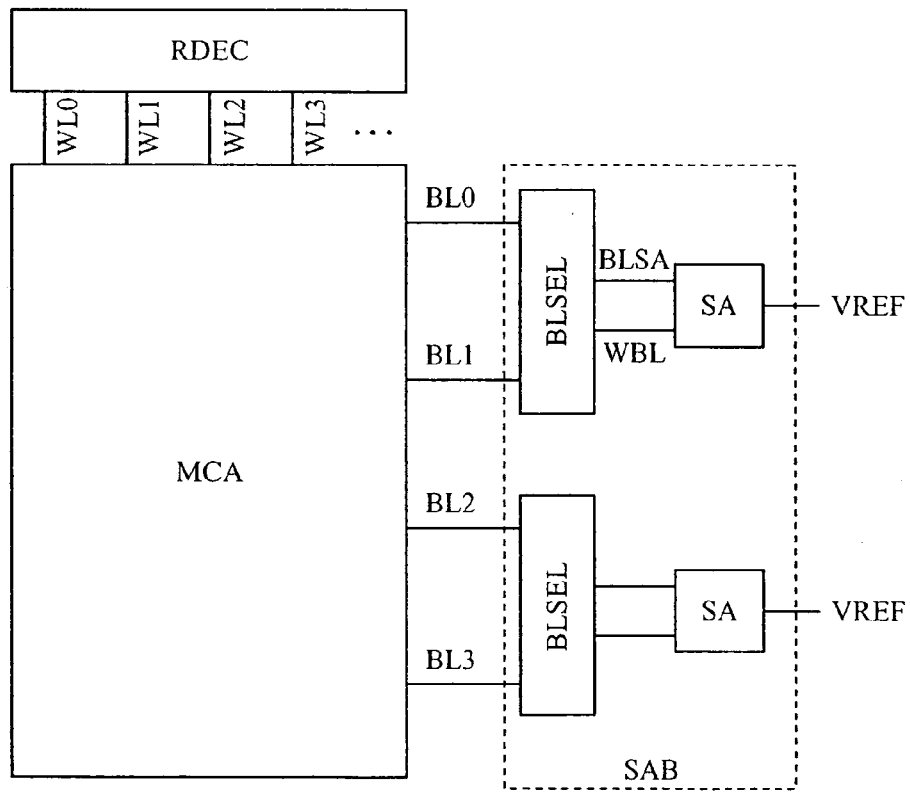
FIG. 14 is a block diagram showing another configuration example of a main part of the phase change memory different from FIG. 2 in the semiconductor device according to the first embodiment of the present invention.

FIG. 14 is a block diagram showing another configuration example of a main part of the phase change memory different from FIG. 2 in the semiconductor device according to the first embodiment of the present invention. In the present configuration example, different from that described in FIG. 2, in the sense amplifier block SAB, two bit lines of the array are connected to one bit line selection circuit BLSEL, and one of them is connected to the sense amplifier circuit SA. In other words, the sense amplifier circuit SA is allotted to two bit lines of the array. The configurations in any of FIG. 3 and FIG. 10 to FIG. 12 can be applied to the configuration of the memory cell array MCA. Also, the configuration of the sense amplifier circuit SA is also similar to that of described in FIG. 7.

Figure 15:
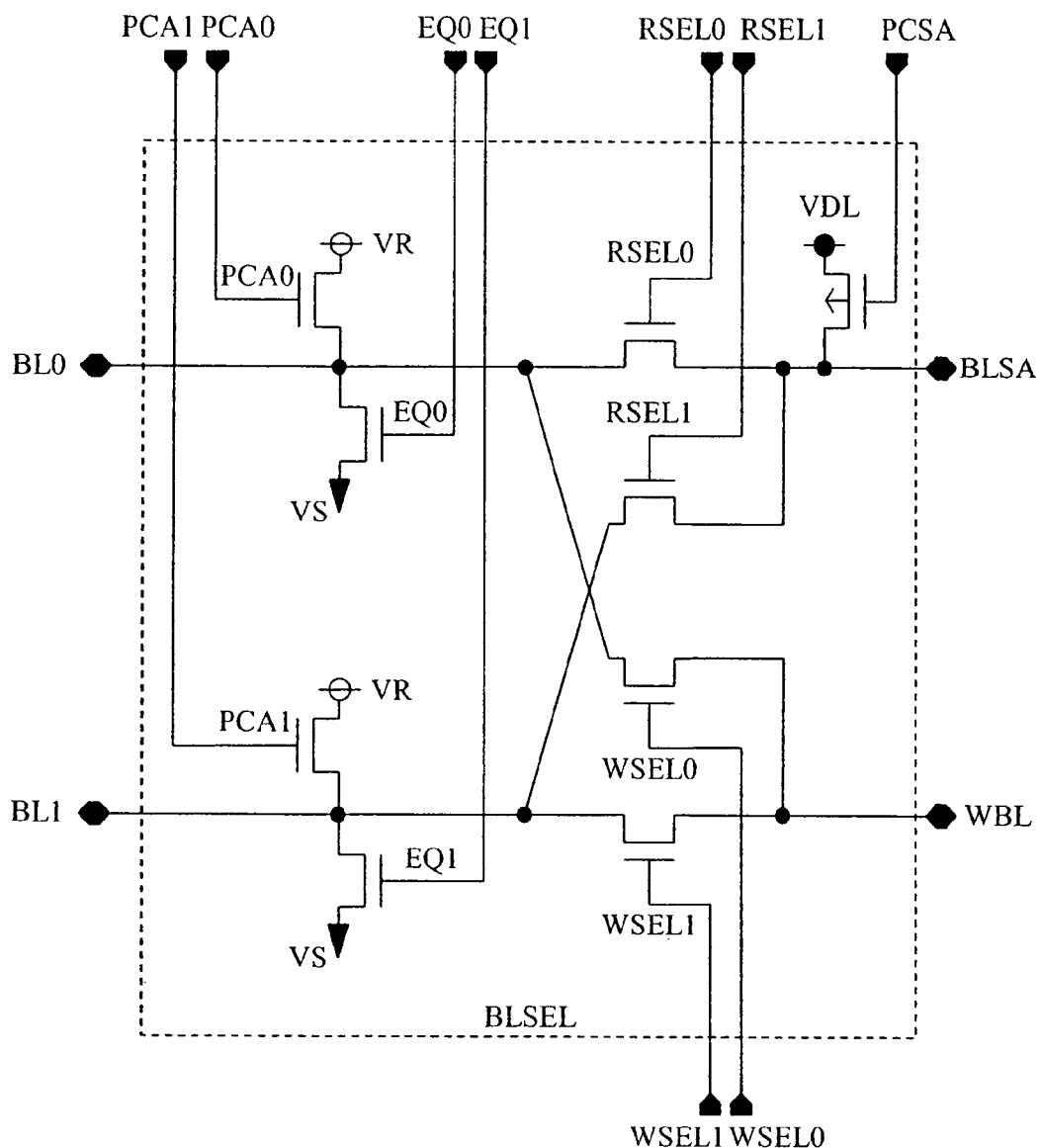
FIG. 15 is a circuit diagram showing an example of the configuration of the bit line selection circuit in the configuration example of FIG. 14.

FIG. 15 is a circuit diagram showing an example of the configuration of the bit line selection circuit in the configuration example of FIG. 14. Similar to FIG. 5 described above, the bit line selection circuit BLSEL of FIG. 15 is provided with the read bit line selection signals RSEL0 to RSEL1 and the write bit line selection signals WSEL0 to WSEL1 for selecting the bit line to be connected to the read bit line BLSA or the write bit line WBL from the two bit lines BL of the array in accordance with an inputted address, read bit line selection switches which are controlled by the read bit line selection signals RSEL 0 to RSEL1 and connect the bit lines BL0 and BL1 in the array to the read bit line BLSA, and write bit line selection switches which are controlled by the write bit line selection signals WSEL0 to WSEL1 and connect the bit lines BL0 and BL1 to the write bit line WBL.

Moreover, the selection circuit BLSEL is further provided with the bit line equalize signals EQ0 and EQ1 and equalize switches controlled by these equalize signals for setting the bit lines BL0 and BL1 to a bit line waiting-period voltage, for example, to the potential VS equal to that of the source lines in a waiting period, the bit line precharge signals PCA0 and PCA1 and precharge switches for setting the bit lines BL0 and BL1 to a desired level, for example, to the read bit line level VR in a read-out period, and the sense amplifier precharge signal PCSA and a sense amplifier precharge switch for setting the read bit line BLSA in the sense amplifier to a desired read voltage VDL.

The read bit line level VR is lower than the sense amplifier precharge voltage VDL. In a read-out operation in the configuration example of FIG. 14, one of the two bit lines is read out while only one of the four bit lines of the memory cell array MCA is read out in the operation of FIG. 1 and FIG. 2 described above. Operations except for that described above are similar to the operations described in the example of the read-out operation waveform of FIG. 1.

The present configuration example is suitable for an operation of reading out a large amount of data since the number of the bit lines that can be read out to the sense amplifiers at the same time is increased in comparison with the above-described configuration example of FIG. 2. Moreover, when the memory cell array MCA has the above-described configuration in which the memory cells are disposed at half of the intersecting points of the word lines and bit lines, an advantage that all of the data of the memory cells which are read out at the same time can be read out to the sense amplifiers is provided.

Figure 16:
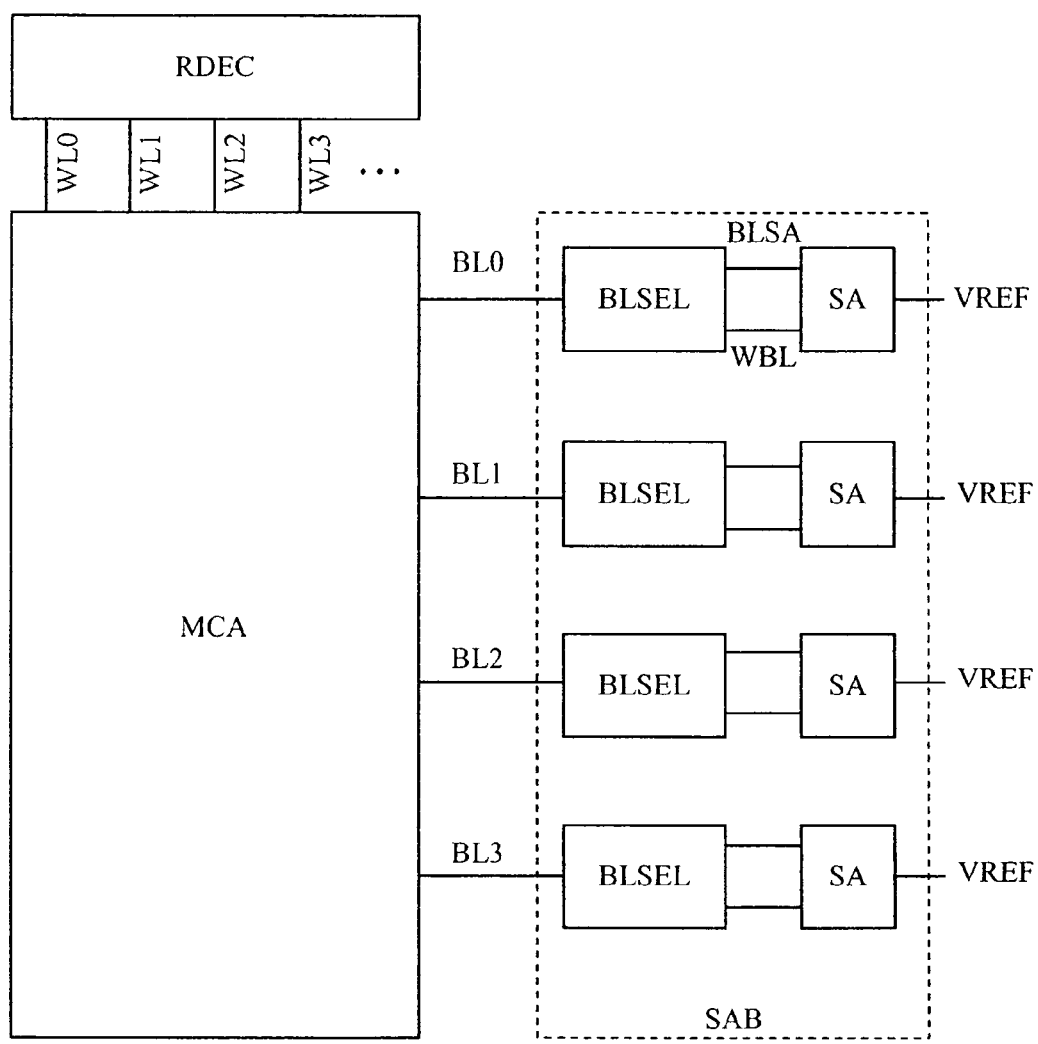
FIG. 16 is a block diagram showing another configuration example of a main part of the phase change memory different from FIG. 2 in the semiconductor device according to the first embodiment of the present invention.

FIG. 16 is a block diagram showing another configuration example of a main part of the phase change memory different from FIG. 2 in the semiconductor device according to the first embodiment of the present invention. In the present configuration example, different from the above-described configuration examples, one sense amplifier circuit SA is connected to each bit line of the array in the sense amplifier block SAB. Consequently, when one word line WL is selected, a large number of the bit lines can be read out to the sense amplifiers, and a large number of pieces of data can be outputted at one time. The configurations of any of FIG. 3 and FIG. 10 to 12 can be applied to the configuration of the memory cell array MCA corresponding to the present configuration example. However, since the sense amplifier circuits SA are connected to all of the bit lines BL, the configuration of FIG. 3 in which data of the memory cells is read out to all the bit lines BL when one word line WL is selected is suitable.

Figure 17:
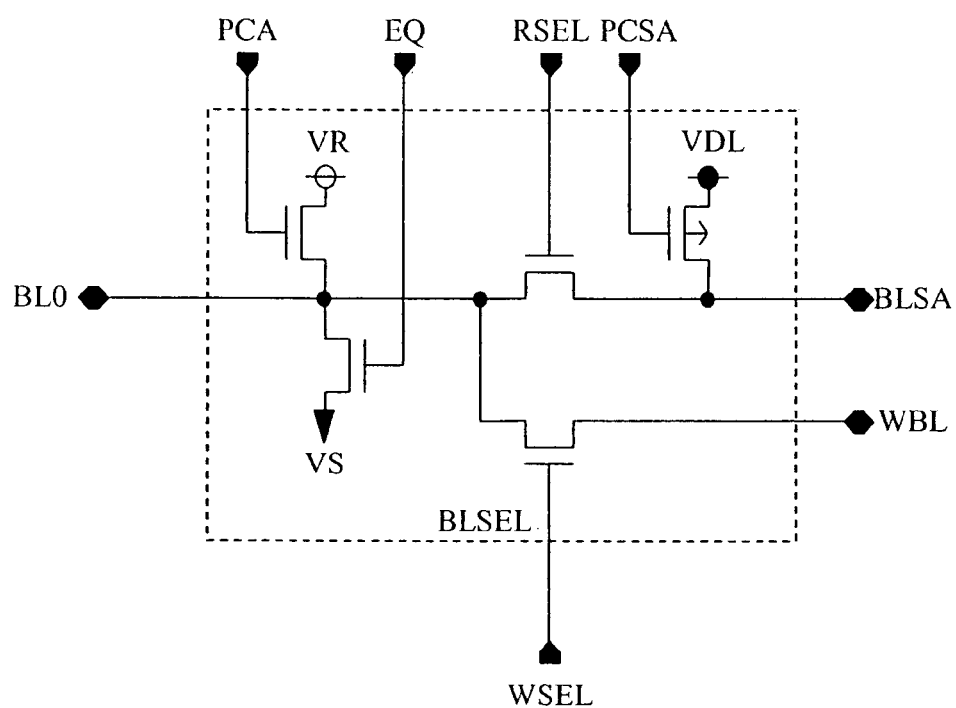
FIG. 17 is a circuit diagram showing an example of the configuration of the bit line selection circuit in the configuration example of FIG. 16.

FIG. 17 is a circuit diagram showing an example of the configuration or the bit line selection circuit in the configuration example of FIG. 16. In the present configuration example, the read bit line BLSA and the write bit line WBL of the sense amplifier correspond to the bit lines BL of the array in a one by one manner. More specifically, the present bit line selection circuit BLSEL is provided with the bit line selection signals BSEL and WSEL and switches thereof for connecting the bit line BL of the array to the read bit line BLSA or the write bit line WBL of the sense amplifier in a read-out operation or a write operation, the equalize signal EQ and an equalize switch for setting the bit line BL of the array to the potential VS equal to the source line during a waiting period, the precharge signal PCA and a precharge switch for setting the bit line BL of the array to the read bit line level VR, and the sense amplifier precharge signal PCSA and a precharge switch for setting the read bit line BLSA to the array voltage VDL. The sense amplifier circuit SA may have the configuration similar to that or FIG. 6 described above.

Figure 18:
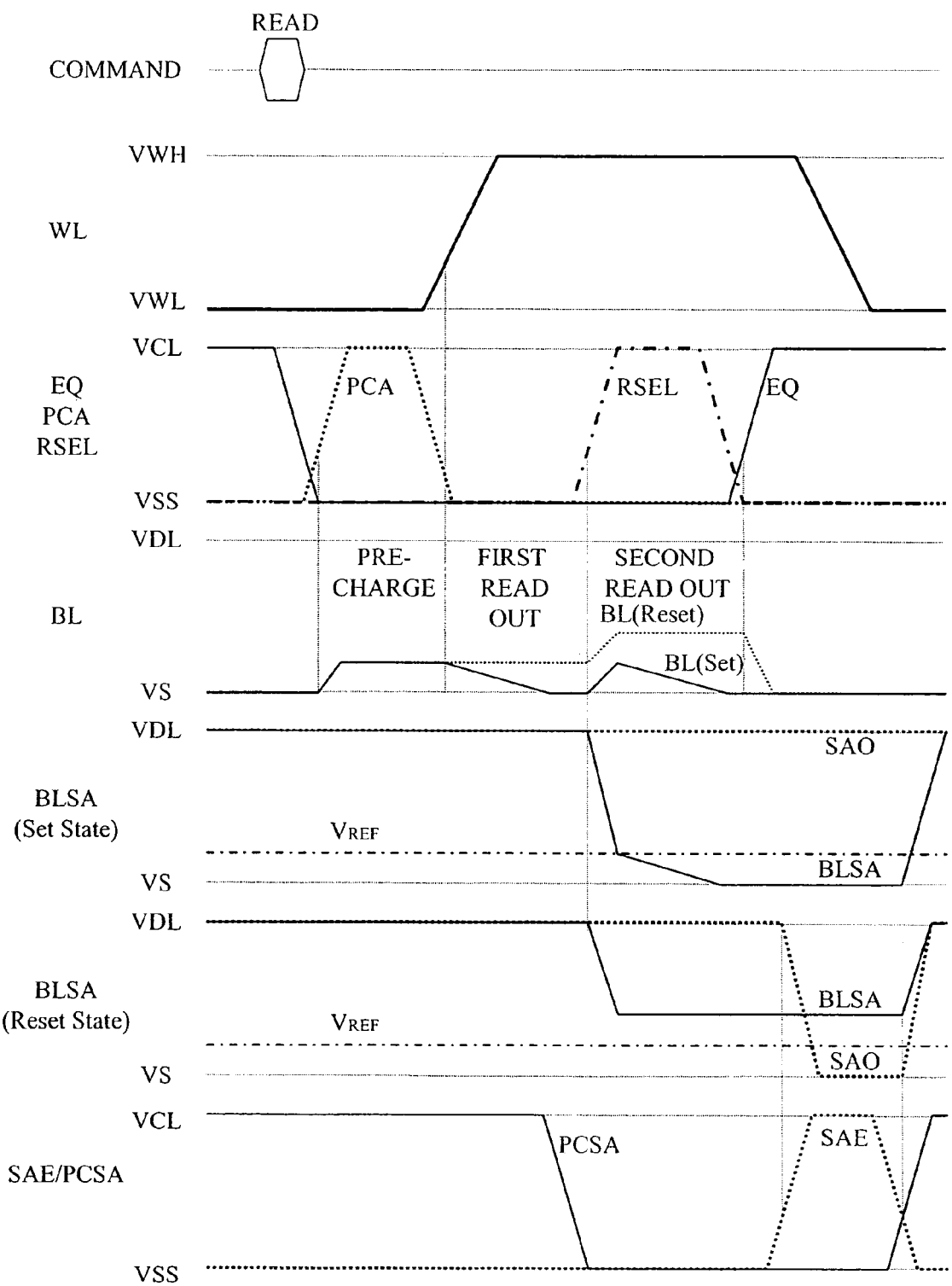
FIG. 18 is a waveform diagram showing an example of a read-out operation in the configuration example of FIG. 16.

FIG. 18 is a waveform diagram showing an example of a read-out operation in the configuration example of FIG. 16. The configuration example of FIG. 16 is characterized in that, since the sense amplifier circuits SA are disposed for all of the read bit lines, no unselected bit line is provided in comparison with the above-described operation waveform example of FIG. 1.

When the configuration example of FIG. 16 is employed as described above, the number of bit lines that can be read out at the same time increases because the sense amplifier circuit is disposed for each bit line. Therefore, successive data read-out operations can be performed at high speed. Furthermore, page read-out operations such as that in DRAM can be readily realized.

(Second Embodiment)

In a second embodiment, a method of generating the reference level in a read-out period will be described with using the above-described configurations and operations. Characteristics of the present method are that the time in which a high voltage is applied during a read-out period is shortened while increasing the read-out signal amount by performing a read out in two steps similar to the above-described read-out operation, and a stable reference level is generated by outputting the reference level by charge sharing. First, circuit configurations for realizing the present read-out operation will be described.

Figure 19:
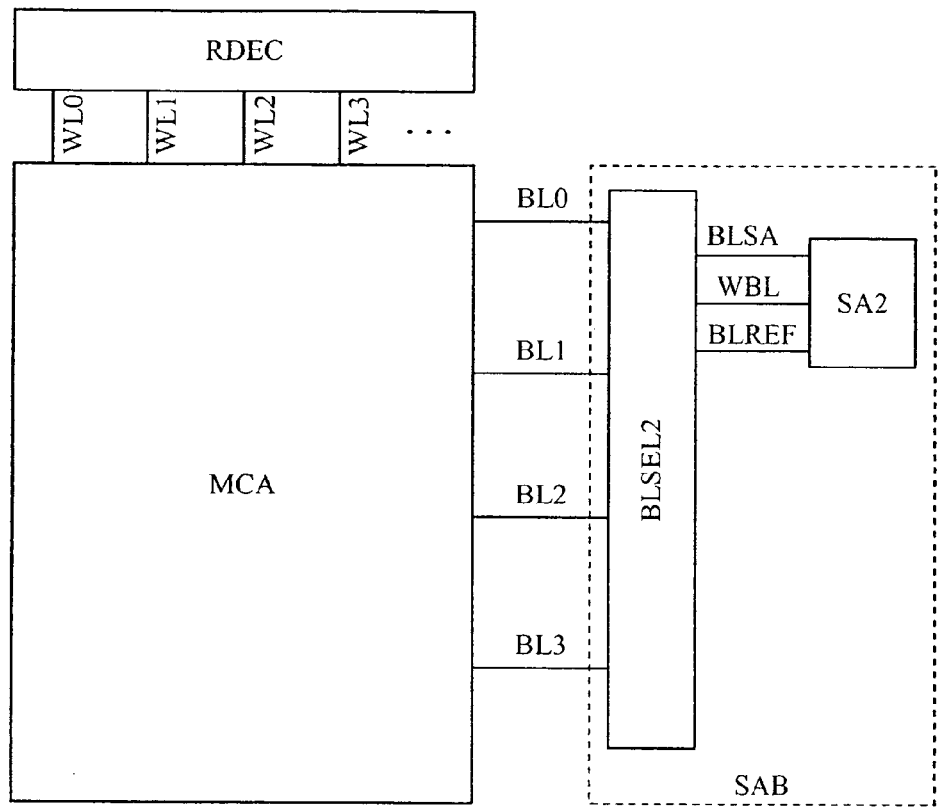
FIG. 19 is a block diagram showing a configuration example of a main part of a phase change memory included in a semiconductor device according to a second embodiment of the present invention.

FIG. 19 is a block diagram showing a configuration example of a main part of the phase change memory included in a semiconductor device according to the second embodiment of the present invention. FIG. 19 shows the memory cell array MCA, the row decoder RDEC for selecting the word lines WL corresponding to inputted addresses, and the sense amplifier block SAB for sensing the data in the selected memory cell and outputting it to outside.

A bit line selection circuit BLSEL2 and a sense amplifier circuit SA2 are disposed in the sense amplifier block SAB. The bit line selection circuit BLSEL2 selects one bit line from four bit lines BL0 to BL3 in accordance with an inputted address, connects the selected bit line to the read bit line BLSA in a read-out period, and connects the line to the write bit line WBL in a write period. Furthermore, different from the cases of FIG. 2 and the like, the bit line selection circuit BLSEL2 of FIG. 19 connects an unselected bit line to a sense amplifier reference bit line BLREF in order to output the reference level.

Figure 20:
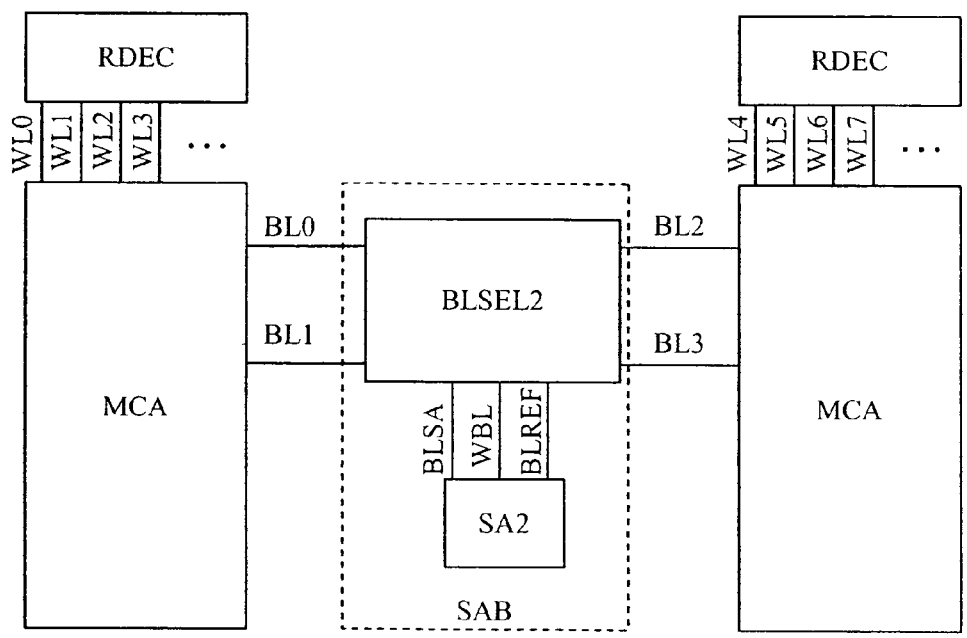
FIG. 20 is a block diagram showing another configuration example of a main part of the phase change memory different from FIG. 19 in the semiconductor device according to the second embodiment of the present invention.

FIG. 20 is a block diagram showing another configuration example of a main part of the phase change memory different from that of FIG. 19 in the semiconductor device according to the second embodiment of the present invention. The present configuration example is a common sense amplifier configuration in which the memory cell arrays MCA are disposed on both sides of the sense amplifier block SAB, and the one sense amplifier block SAB is shared by the two memory cell arrays MCA. The sense amplifier block SAB is provided with the bit line selection circuit BLSEL2 for connecting any of the bit lines of the left and right arrays to the read bit line BLSA or the write bit line WBL of the sense amplifier and for connecting an unselected bit line to the reference bit line BLREF, and the sense amplifier circuit SA2 for outputting data stored in a memory cell to outside based on signal voltages between the read bit line BLSA and the reference bit line BLREF and for driving the write bit line WBL to write data to a memory cell in accordance with data from outside.

When the common sense amplifier configuration is employed as described above, the part of the memory array MA can be readily composed by a multi-divided array on the chip as shown in FIG. 21. Moreover, since the capacity per one bit line can be reduced by virtue of such a configuration, reduction in power consumption and high-speed operations can be realized.

Next, the configurations of the memory cell arrays MCA of FIG. 19 and FIG. 20 will be described. The memory cell array configurations suitable in FIG. 19 are those described in FIG. 10, FIG. 11, and FIG. 12. In any of the configurations, the memory cells are disposed at only half of the intersecting points of the bit lines and the word lines. In the case where these configurations are employed, when the word line WL is selected, there are bit lines BL to which no memory cell is connected in the same memory cell array MCA. Therefore, the bit line BL can be connected to the reference bit line BLREF in the sense amplifier.

On the other hand, the configuration of the memory cell array MCA of FIG. 20 may be any of those in FIG. 3 and FIG. 10 to FIG. 12. It is not always necessary to select the bit line BL to be connected to the reference bit line BLREF from the memory cell array MCA in which the word lines WL are activated, and the bit line BL in the adjacent memory array MCA can be employed. Therefore, in FIG. 20 employing the common sense amplifier configuration, the configuration of the memory cell array of FIG. 3 in which the memory cells are disposed at all the intersecting points can be also applied.

Figure 22:
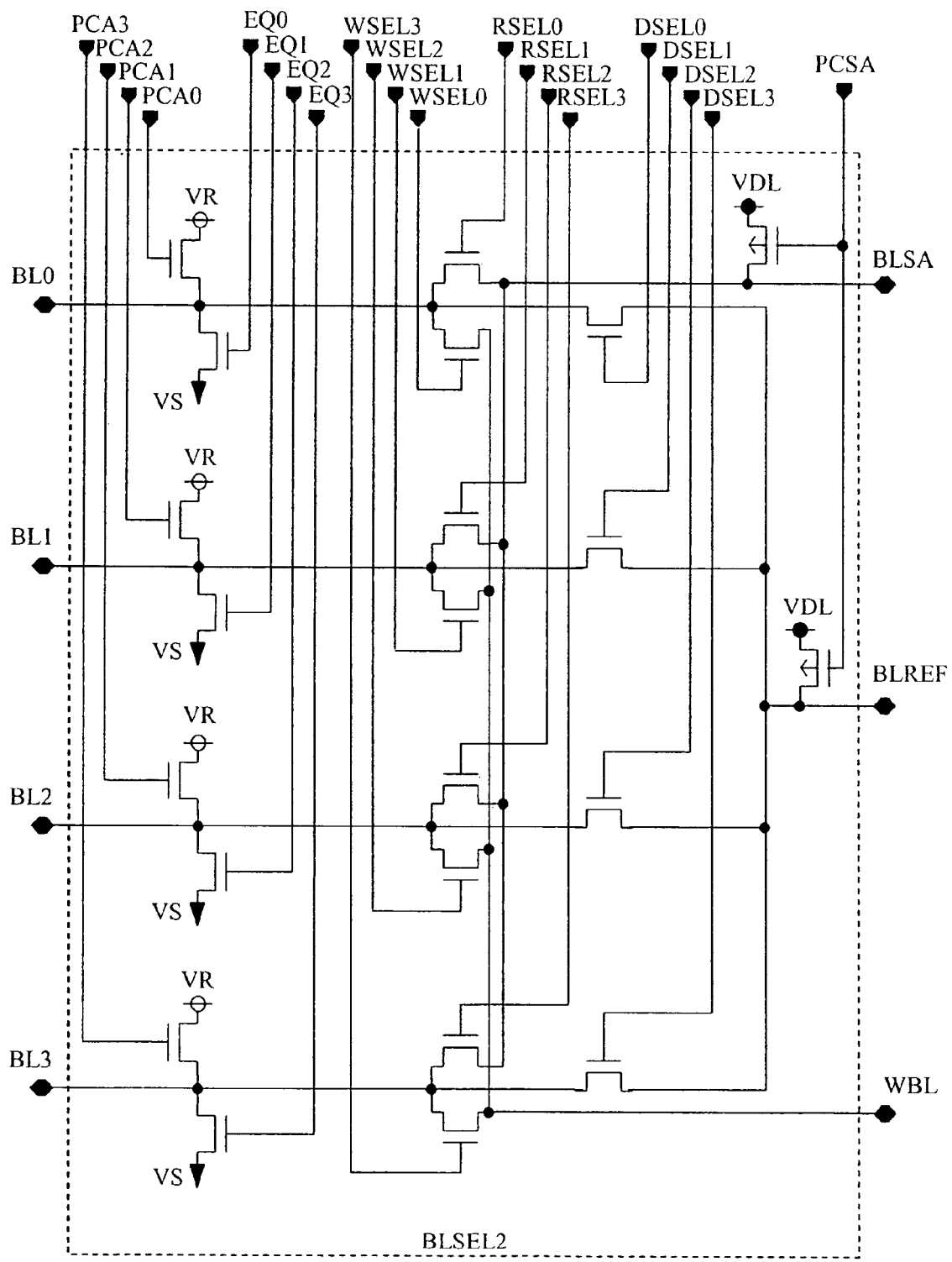
FIG. 22 is a circuit diagram showing an example of the configuration of the bit line selection circuits in the configuration examples of FIG. 19 and FIG. 20.

FIG. 22 is a circuit diagram showing an example of the configuration of the bit line selection circuits in the configuration examples of FIG. 19 and FIG. 20. Similar to FIG. 5 described above, the present configuration example is provided with the read bit line selection signals RSEL0 to RSEL3 and selection switches controlled by them for connecting the bit lines BL0 to BL3 of the array to the read bit line BLSA, the write bit line selection signals WSEL0 to WSEL3 and selection switches controlled by them, the equalize signals EQ0 to EQ3 and equalize switches for setting the bit lines BL0 to BL3 to the source-line potential VS during a waiting period, the precharge signals PCA0 to PCA3 and precharge switches for setting the bit line which has been selected in a read-out period to the read bit line level VR, and the sense amplifier precharge signal PCSA and a sense amplifier precharge switch for setting the read bit line BLSA to a desired level (for example, VDL) in a read-out period.

Moreover, the present configuration is further provided with reference selection signals DSEL0 to DSEL3 for connecting the bit lines BL0 to BL3 of the array to the reference bit line BLREF which is paired with the read bit line BLSA, reference selection switches which are controlled by the reference selection signals, and the sense amplifier precharge signal PCSA and a sense amplifier precharge switch for setting the reference bit line BLREF to a desired level (for example, VDL) in a read-out period similar to the above-described read bit line BLSA. In a read-out operation, the reference selection switches connect an unselected bit line in which no memory cell is activated to the reference bit line BLREF in the sense amplifier. Accordingly, in the read-out operation, a reference level is generated by charge sharing between the capacity of the bit line and the capacity of the reference bit line BLREF in the sense amplifier.

Figure 23:
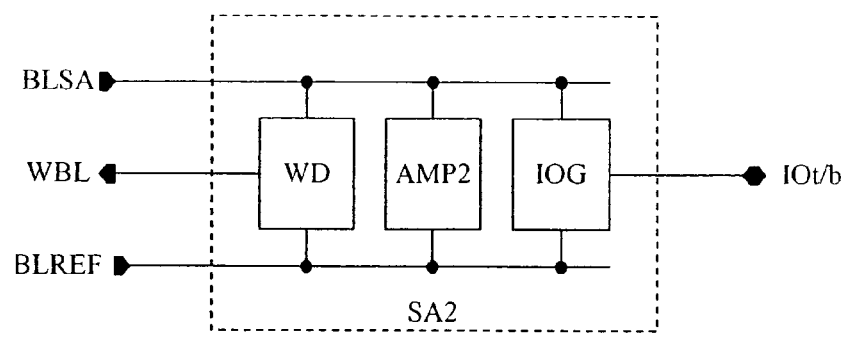
FIG. 23 is a circuit diagram showing an example of the configuration of the sense amplifier circuits in the configuration examples of FIG. 19 and FIG. 20.

FIG. 23 is a circuit diagram showing an example of the configuration of the sense amplifier circuit in the configuration examples of FIG. 19 and FIG. 20. The above-described sense amplifier circuit SA of FIG. 7 has the configuration in which the read and write data buses are separated. However, in the sense amplifier circuit SA2 of FIG. 23, the read and write data buses are in common.

More specifically, in the read-out operation, complementary signals are read out to the read bit line BLSA and the reference bit line BLREF in the sense amplifier, and, after amplifying these signals in an amplifier circuit AMP2, the amplified signals are outputted to an input/output line IOt/b via an input/output gate unit IOG. Meanwhile, in a write operation, write data inputted from outside is once written to the read bit line BLSA and the reference bit line BLREF as complementary signals via the input/output line IOt/b and the input/output gate unit IOG. Then, by using the data, the write driver WD writes the data to the storage element PCR in the memory cell via the write bit line WBL and the bit line BL in the array.

As described above, in the present configuration example, the time when the input/output line IOt/b is being occupied can be shortened by once writing data to the paired bit lines BLSA/BLREF in the sense amplifier. Therefore, the operation cycle of the input/output line IOt/b can be shortened. The configuration of the write driver WD may be the configuration in which one of the data buses DATAt/DATAb in the configurations shown in FIG. 8A and FIG. 8B is replaced by the reference bit line BLREF and the other one is replaced by the read bit line BLSA.

Figure 24:
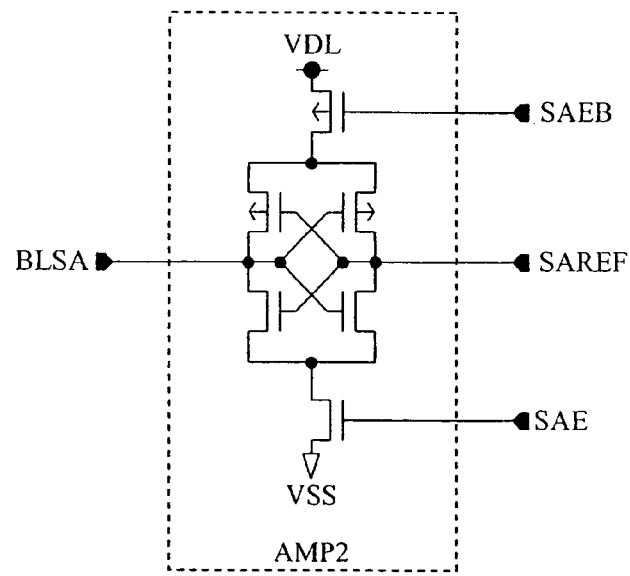
FIG. 24 is a circuit diagram showing an example of the configuration of the amplifier circuit in the sense amplifier circuit of FIG. 23.

FIG. 24 is a circuit diagram showing an example of the configuration of the amplifier circuit in the sense amplifier circuit of FIG. 23. The present amplifier circuit AMP2 has a configuration employing a cross-coupled type amplifier so that it can be utilized for once retaining the write data described above.

Figure 25:
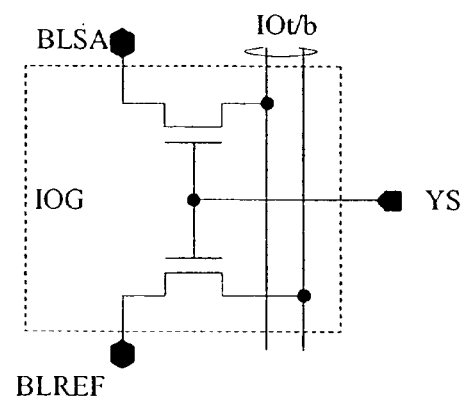
FIG. 25 is a circuit diagram showing an example of the configuration of the input/output gate unit in the sense amplifier circuit of FIG. 23.

FIG. 25 is a circuit diagram showing an example of the configuration of the input/output gate unit in the sense amplifier circuit of FIG. 23. In the input/output gate unit IOG, the read bit line BLSA and the reference bit line BLREF in the sense amplifier are connected to the input/output line IOt/b by a column selection line YS which is activated by an inputted address to perform the data transfer. It should be noted that the circuits shown in FIG. 24 and FIG. 25 are not limited to those shown here, and other circuit configurations can be utilized instead as long as they have the similar functions.

Figure 26:
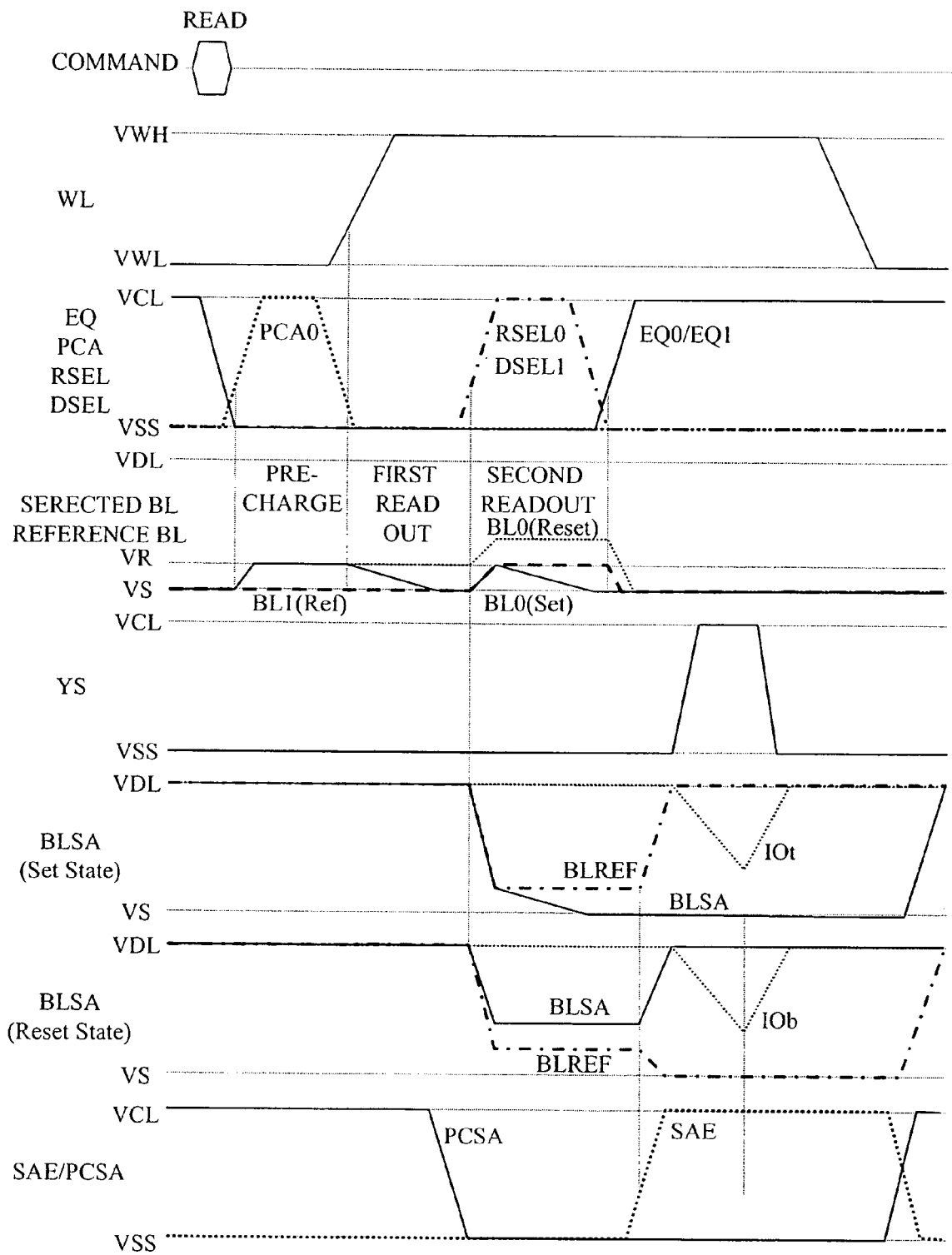
FIG. 26 is a waveform diagram showing an example of the read-out operation of the phase change memory included in the semiconductor device according to the second embodiment of the present invention.

Next, the read-out operation of the phase change memory having above-described configurations will be described. FIG. 26 is a waveform diagram showing an example of the read-out operation of the phase change memory which is included in the semiconductor device according to the second embodiment of the present invention. In the present operation waveform diagram, an operation of reading out a memory cell which is connected to the bit line BL0 with using the bit line BL1 as a reference is presupposed. Also, the configuration in which the memory cells MC are disposed at half of the intersecting points among the intersecting points of the word lines and the bit lines as shown in FIG. 10, FIG. 11, and FIG. 12 is presupposed as the memory cell array MCA.

In FIG. 26, when the read command READ is inputted from outside, the equalize signals EQ0 and EQ1 of the bit line BL0 to which the memory cell to be read out is connected and the bit line BL1 for reference transit to an inactivated state in accordance with an address inputted at the same time as the command. Subsequently, the precharge signal PCA0 of the bit line BL0 to which the memory cell to be read out is connected attains an activated state, and the bit line BL0 is precharged to the read bit line level VR.

After the precharge, the word line WL corresponding to the address which has been inputted at the same time as the command is changed from an unselected state to a selected state. In accordance with this, the potential of the bit line BL0 changes depending on the resistance state of the storage element PCR of the memory cell. At this point, when the storage element PCR of the memory cell MC is in a high resistance state, a current does not flow via the memory cell MC. Therefore, the potential of the bit line BL0 is little varied and maintains the read bit line level VR. Meanwhile, when the storage element PCR of the memory cell MC is in a low resistance state, a current flows via the memory cell MC, and the potential of the bit line BL0 transits toward the potential VS of the source line. At this time, the reference bit line BL1 maintains the source line potential VS.

Then, the read bit line selection signal RSEL0 of the bit line BL0 and the reference bit line selection signal DSEL1 of the bit line BL1 are activated. Consequently, charge sharing occurs between the read bit line BLSA in the sense amplifier and the bit line BL0 in the array, and when the storage element PCR is in the low resistance state, the voltage of the bit line BL0 becomes VDL×CSA/(CSA+CB), and when it is in the high resistance state, the voltage becomes VR'=(VDL×CSA+VR×CB)/(CSA+CB). Herein, CSA denotes the capacity of the read bit line BLSA, and CB denotes the capacity of the bit line BL0 in the array. Meanwhile, the reference bit line BL1 shares the charge with the reference bit line BLREF in the sense amplifier, and it transits to VDL×CSA/(CSA+CB) if the capacity of the reference bit line BLREF is equal to the capacity of the read bit line BLSA.

Thereafter, since the word line is still in the selected state, a read current flows through the memory cell which is in the low resistance state. Consequently, the potential of the selected bit line BL0 in the low resistance state transits again toward the source-line potential VS. Meanwhile, when the memory cell is in the high resistance state, the bit line potential VR' after the charge sharing is maintained. Also, the bit line BL1 serving as a reference and the reference bit line BLREF in the sense amplifier maintain the level after the charge sharing, that is, VDL×CSA/(CSA+CB). As a result, the potential of the reference bit line BLREF, that is, VDL×CSA/(CSA+CB) is a level which is determined by a structural parameter. Also, it is between the bit line potential VS of the low resistance state and the bit line potential VR' of the high resistance state, and it can be employed as a reference potential of the sense amplifier.

Furthermore, while the voltage applied in the low resistance state in the read-period is at most the read bit line level VR, a large read-out signal amount VR'=(VDL×CSA+VR× CB)/(CSA+CB) can be obtained. In other words, a large read-out signal amount can be ensured while keeping a small read current in the read-out operation. Furthermore, there is an advantage that, since the reference level is generated by use of the unselected bit line, the stable low-voltage reference level which is not readily influenced by the internal voltage variations can be generated. Thus, a highly reliable read-out operation can be performed.

When minute signals are read out to the bit line pair BLSA/BLREF in the sense amplifier, the read bit line selection signal RSEL0 and the reference bit line selection signal DSEL1 transit from the activated state to an unselected state. Consequently, the read bit line BLSA and the reference bit line BLREF are separated from the bit lines BL0 and BL1 in the array. When each of the bit lines is separated, the equalize signals EQ0 and EQ1 are activated, and the bit lines BL0 and BL1 in the array are set to the source-line level VS. Accordingly, no voltage is applied to the storage elements PCR, and data destruction can be prevented.

Approximately at the same time with this, the sense amplifier activation signal SAE is activated so as to amplify the minute signals between the bit line pair BLSA/BLREF in the sense amplifier to the bit line amplitude voltage VDL by the amplifier circuit AMP2 of the sense amplifier circuit SA2. Thereafter, by activating a column selection signal YS corresponding to the inputted address from the unselected level VSS to a selected level VCL, the input/output gate unit IOG is activated and the data read out from the memory cell MC is outputted to the input/output line IOt/b.

When output of the data is completed, the activated word line WL transits from the high potential state VWH which is a selected state to the unselected level VWL. Approximately at the same time with this, the sense amplifier activation signal SAE becomes an unselected state, and the bit line pair BLSA/BLREF in the sense amplifier is precharged to the array voltage VDL and attains a waiting state when the sense amplifier precharge signals PCSA are activated. At this time, all of the bit lines in the array are precharged to the source-line potential VS, and no voltage is applied to the storage element PCR and between the source/drain of the memory cell transistor MT. Thus, since no disturbance current flows, data destruction can be prevented.

Figure 27:
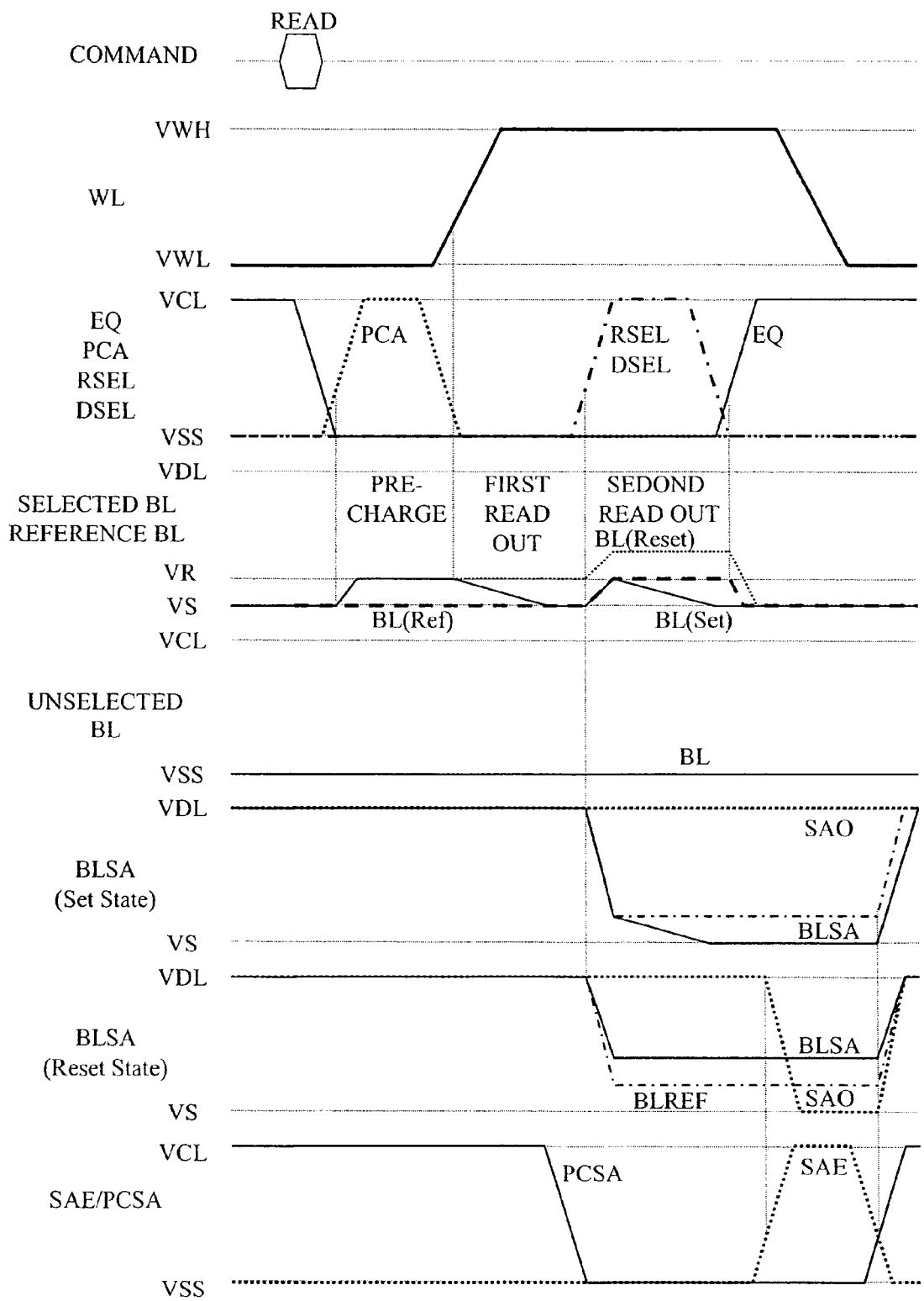
FIG. 27 is a waveform diagram showing another example of the read-out operation of the phase change memory different from FIG. 26 in the semiconductor device according to the second embodiment of the present invention.

FIG. 27 is a waveform diagram showing another example of a read-out operation of the phase change memory different from FIG. 26 in the semiconductor device according to the second embodiment of the present invention. FIG. 27 shows an operation waveform in the configuration in which the sense amplifier circuit SA2 is replaced by the sense amplifier circuit SA of FIG. 6 in the above-described method of generating the reference potential in the sense amplifier region. In comparison with FIG. 26 described above, since the gate-receiving type amplifier circuit AMP is used, the bit line pair BLSA/BLREF (VREF in FIG. 6) in the sense amplifier maintains the voltage level in the read-out operation, and even when the amplifier circuit AMP is activated, the sense amplifier output node SAO is merely driven and the potential of the bit line pair BLSA/BLREF in the sense amplifier is not amplified. Other operations are similar to those of FIG. 26 described above.

Figure 28:
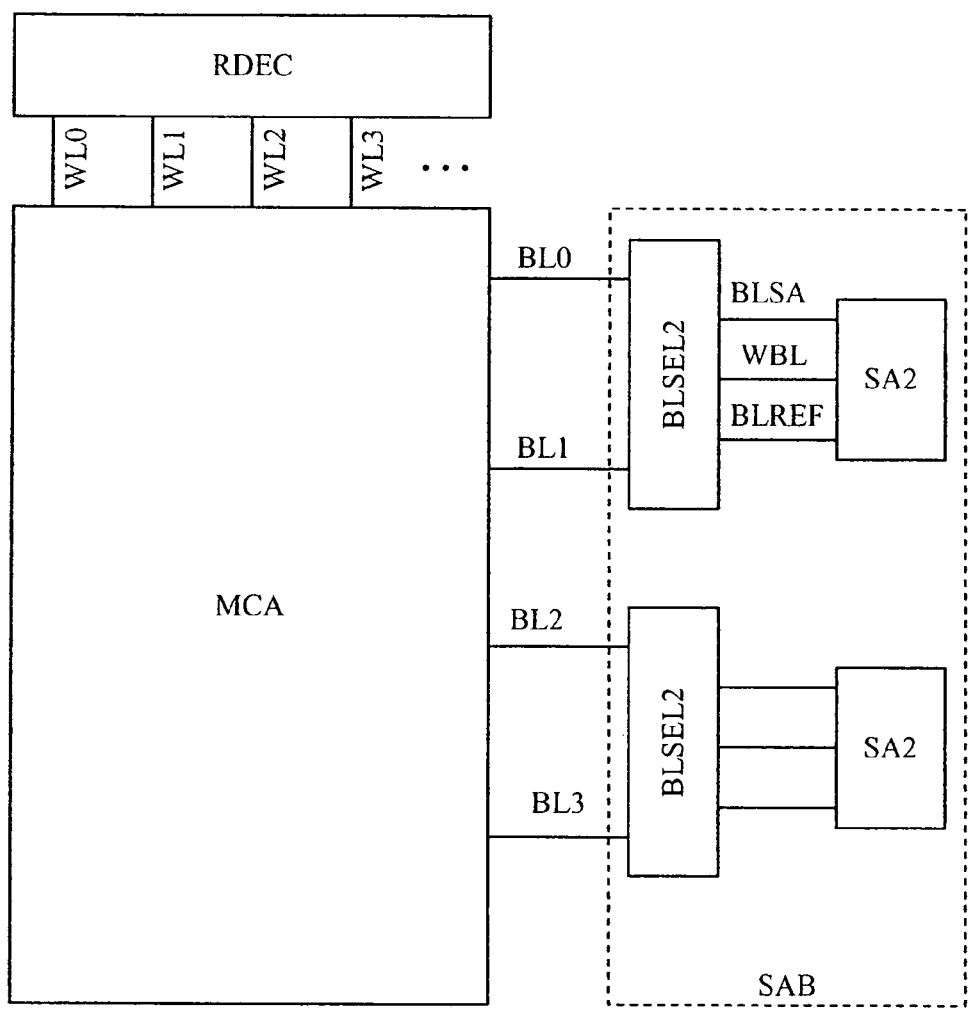
FIG. 28 is a block diagram showing another configuration example of a main part of the phase change memory different from FIG. 19 in the semiconductor device according to the second embodiment of the present invention.

FIG. 28 is a block diagram showing another configuration example of a main part of the phase change memory different from FIG. 19 in the semiconductor device according to the second embodiment of the present invention. In the present configuration, one sense amplifier circuit SA2 is disposed for two bit lines in the array in the sense amplifier block SAB. The configuration of the memory cell array MCA in the present configuration may be any of those described in FIG. 3 and FIG. 10 to FIG. 12. Among the bit lines of the memory array, one of the two bit lines is connected to the sense amplifier circuit SA2 and can be outputted to the outside. Therefore, this configuration is suitable for the operations of outputting or writing a large amount of data.

Figure 29:
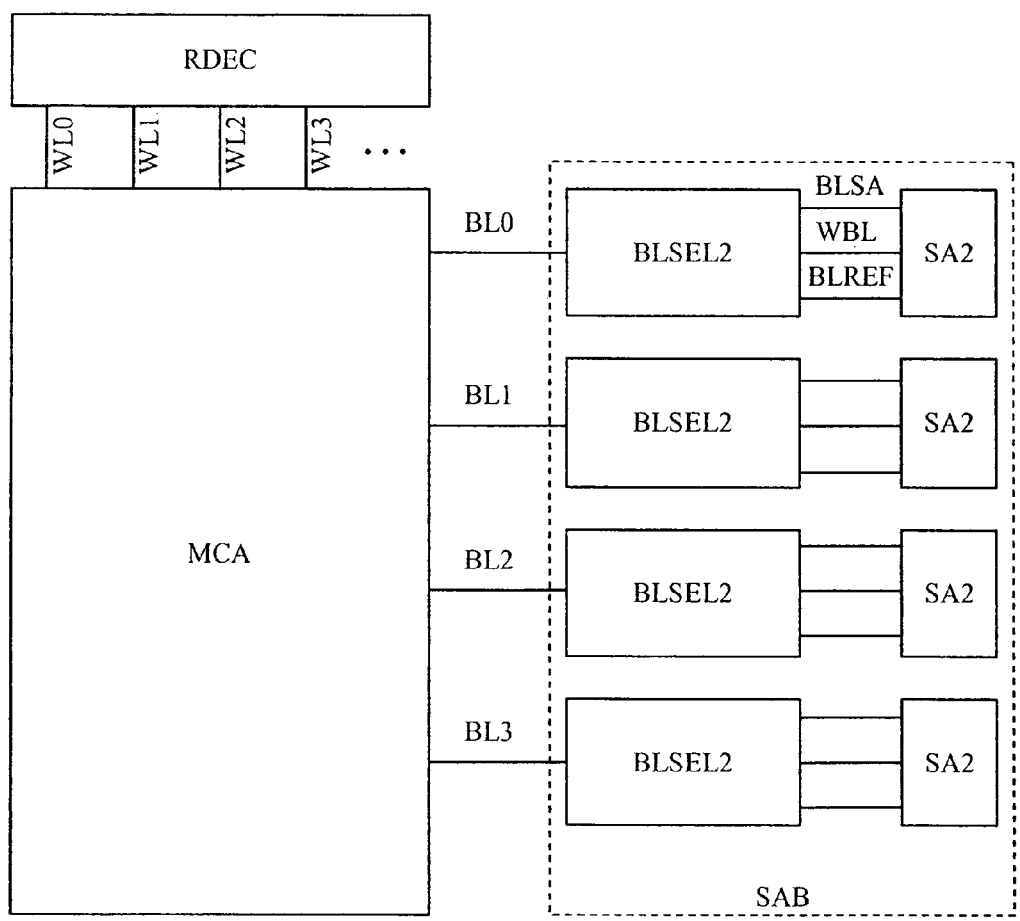
FIG. 29 is a block diagram showing another configuration example of a main part of the phase change memory different from FIG. 19 in the semiconductor device according to the second embodiment of the present invention.

FIG. 29 is a block diagram showing another configuration example of a main part of the phase change memory different from FIG. 19 in the semiconductor device according to the second embodiment of the present invention. In the present configuration, one sense amplifier circuit SA2 is disposed for one bit line in the array in the sense amplifier block SAB. The configurations of FIG. 10 to 12 described above can be applied to the configuration of the memory cell array MCA in this case. However, the configuration of FIG. 3 in which memory cells are disposed at all of the intersecting points of the word lines WL and the bit lines BL is preferable. Since data of all bit lines can be read out to the sense amplifiers, this configuration is suitable for the operations of reading/writing a large amount of data at the same time.

Figure 30A:
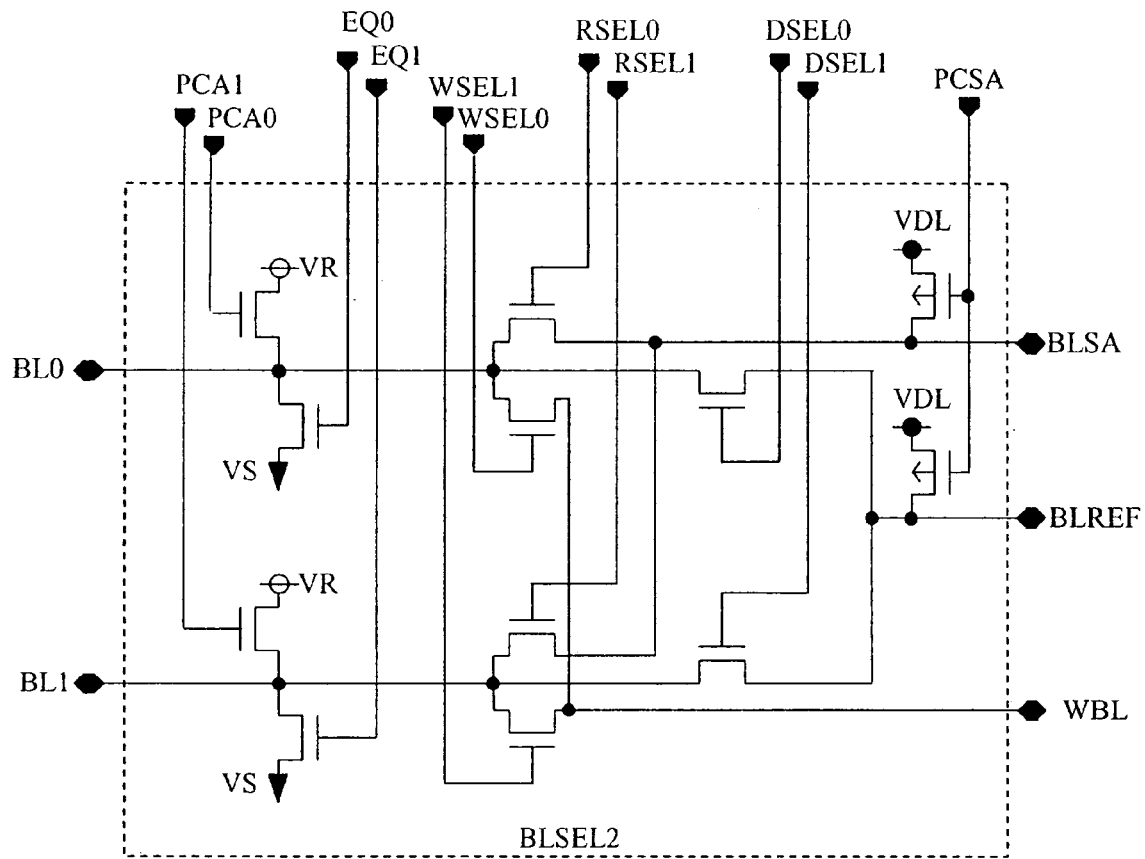
FIG. 30A is a circuit diagram showing an example of the configuration of the bit line selection circuit corresponding to the configuration example of FIG. 28.
Figure 30B:
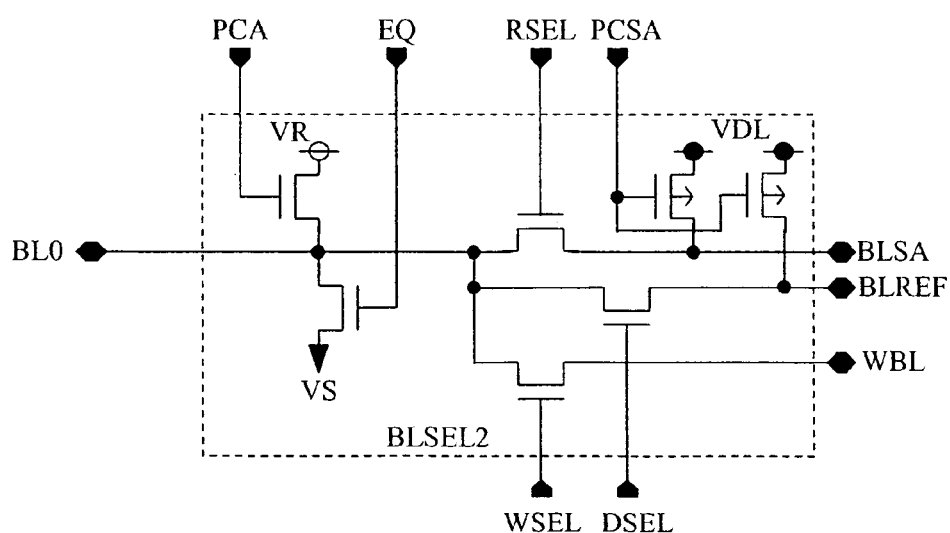
FIG. 30B is a circuit diagram showing an example of the configuration of the bit line selection circuit corresponding to the configuration example of FIG. 29.
Figure 31:
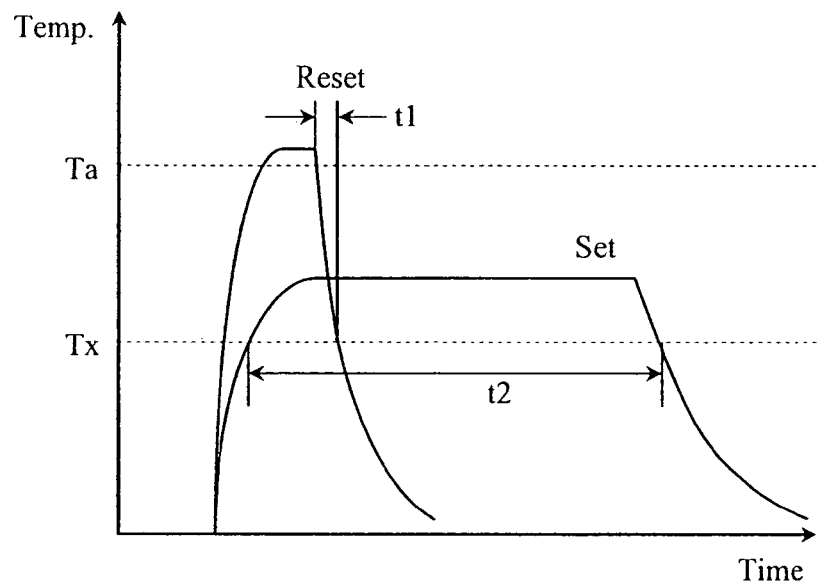
FIG. 31 is a diagram illustrating rewrite principles of the phase change element.
Figure 32:
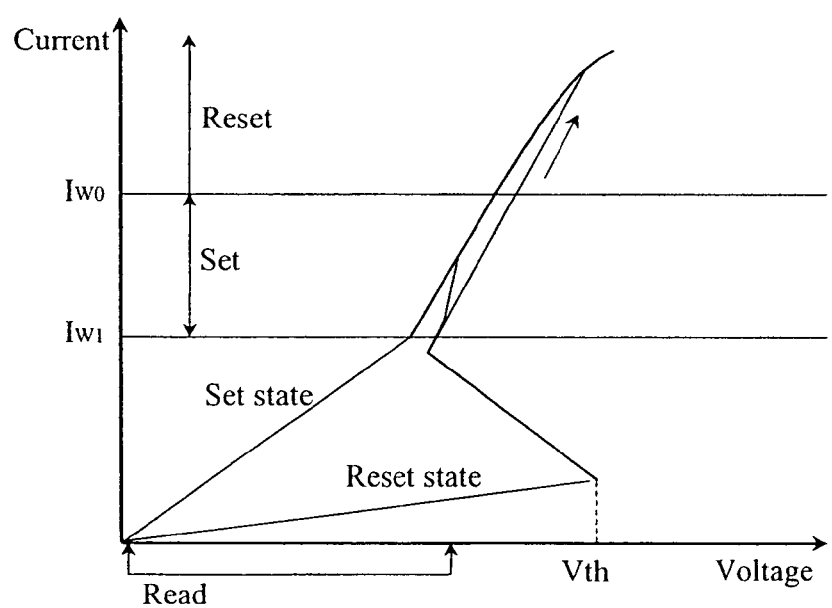
FIG. 32 is a diagram illustrating the current/voltage properties of the phase change element.

FIG. 30A and FIG. 30B are circuit diagrams showing examples of the configuration of the bit line selection circuits in the configuration examples of FIG. 28 and FIG. 29, in which FIG. 30A shows the configuration example corresponding to FIG. 28, and FIG. 30B shows the configuration example corresponding to FIG. 29. The bit line selection circuit BLSEL2 shown in FIG. 30A has a configuration in which signals, switches, and others for connecting either of the two bit lines BL0 and BL1 in the array to the reference bit line BLREF are added to the above-described bit line selection circuit BLSEL of FIG. 15. The bit line selection circuit BLSEL2 shown in FIG. 30B has a configuration in which a signal, a switch, and others for connecting one bit line BL0 in the array to the reference bit line BLREF are added to the above-described bit line selection circuit BLSEL of FIG. 17. The components added in relation to these reference bit lines BLREF are similar to those of the case of FIG. 22 described above. Therefore, detailed descriptions thereof will be omitted.

Advantages of the semiconductor device according to the second embodiment will be described. In this embodiment, similar to the above-described first embodiment, while preventing the destructive read operation by reducing the voltage applied in the read out, a large read-out signal can be ensured in comparison with the read-out applied voltage by performing the read out in two separate steps with low voltages. Furthermore, in the present embodiment, since the low-voltage reference level is generated by utilizing an unselected read bit line, a stable low-voltage reference level can be generated without being affected by the internal operation voltage variation.

In the foregoing, the invention made by the inventor of the present invention has been concretely described based on the embodiments. However, it is needless to say that the present invention is not limited to the foregoing embodiments and various modifications and alterations can be made within the scope of the present invention.

The present invention is desired to be applied to semiconductor devices employing processing technologies of 180 nm or less in which rewrite currents of phase change elements can be reduced. Even in earlier process generations, similar effects can be obtained by reducing the contact areas to the phase change elements. In addition, it goes without saying that the present invention can be applied to further miniaturized generations. Moreover, as an operating voltage, the external power supply voltage VCC is desirably 2.5 V, 1.8 V, 1.5 V, or lower. When the voltage is reduced, since the power consumption is suppressed and the voltage applied to the device is reduced, reliability can be improved.

The voltage of 0 V or lower is suitable as the unselected level VWL of the word lines. When it is 0 V, no particular power supply circuit is required, and the chip area can be reduced. In addition, when it is a negative voltage, even when the threshold value of the memory cell transistors is reduced in order to improve the current driving force, the sub-threshold current in a waiting period can be reduced. As a result, it is possible to achieve the reduction in power consumption, and moreover, the reduction in the current flowing through the phase change elements in an unselected period. Furthermore, disturbance of unselected read/write memory cells can be suppressed, and data reliability and film reliability can be improved.

The word line selection level VWH is desirably equal to an external power supply voltage such as 2.5 V, 1.8 V, or 1.5 V. Alternatively, the voltage equal to that of a peripheral circuit power supply may be employed. Also, in order to ensure the current driving force of the memory cell transistor, a high voltage such as 2.0 V or 2.5 V may be employed by use of an internal step-up power supply. When the source-line level VS is equal to the ground level VSS, no extra power supply circuit is required, and the area can be reduced. The ground level VSS is 0 V. The peripheral circuit voltage VCL and the array voltage VDL are desirably about 1.0 V to 1.8 V. When the array voltage is a voltage lower than the peripheral circuit voltage, there is an advantage that power consumption can be reduced. Within this scope, peripheral transistors produced by normal CMOS processes can be utilized, and processes typical for memory cells are not required, and processes can be simplified.

The reset write voltage VWR among write voltages is desirably equal to the peripheral circuit voltage or equal to the word line selection level VWH. When a high voltage is employed, a large current can be ensured even in small memory transistors, and reduction in area can be realized. The set write voltage is desirably equal to or lower than the peripheral circuit voltage VCL. When a low voltage is employed, the current at the time of write operation can be reduced in comparison with a reset operation, and erroneous reset operations can be prevented.

Also, the read bit line level VR is desirably a voltage that does not cause disturbance at the time of a read-out operation of the element, for example, about 0.2 V to 0.4 V. When the reference level VREF in the present invention is equal to the read bit line level VR, the power supply circuit can be shared, and the power supply noise in a read out can be cancelled out as in-phase noise. Furthermore, the present invention can be applied to a single unit of memory chip and to a logic-embedded memory.

The semiconductor device according to the present invention is a technology effectively applied to a semiconductor device having an integrated memory circuit, a logic-embedded memory in which memory circuits and logic circuits are provided on one semiconductor substrate, or an analog circuit, each of which is formed by using a phase change material.

What is claimed is:

1. A semiconductor device comprising:
    a plurality of word lines;
    a first bit line;
    a sense amplifier;
    a plurality of memory cells disposed at arbitrary intersecting points of said plurality of word lines and said first bit line;
    a second bit line and a third bit line connected to said sense amplifier;
    a first switch for providing a first potential to said first bit line;
    a second switch for providing a second potential to said second bit line; and
    a third switch for connecting said first bit line with said second bit line,
    wherein, after said first switch is inactivated, any of said plurality of word lines is activated, and said third switch is activated.

2. The semiconductor device according to claim 1,
wherein said first potential is lower than said second potential.

3. The semiconductor device according to claim 1,
wherein a third potential is provided to said third bit line, and
said third potential is lower than said second potential.

4. The semiconductor device according to claim 3,
wherein said third potential is outputted by an internal power-supply step-down circuit.

5. The semiconductor device according to claim 1, further comprising:
a fourth bit line disposed in parallel to said first bit line;
a seventh switch for providing said second potential to said third bit line;
a fourth switch for providing a fourth potential to said fourth bit line; and
a fifth switch for connecting said fourth bit line with said third bit line,
wherein said second potential is higher than said first potential,
said fourth potential is lower than said first potential, and,
after said fourth and seventh switches are inactivated, said fifth switch is activated.

6. The semiconductor device according to claim 1,
wherein each of said plurality of memory cells is comprised of a first MISFET and a variable resistive element,
a first terminal of said variable resistive element is connected to said first bit line,
a second terminal of said variable resistive element is connected to one of source/drain of said first MISFET,
a gate of said first MISFET is connected to any one of said plurality of word lines, and
the other of the source/drain of said first MISFET is connected to a common source line.

7. The semiconductor device according to claim 6,
wherein a sixth switch for providing a fourth potential is disposed on said first bit line,
said fourth potential is provided to said common source line, and
said fourth potential is lower than said first and second potentials.

8. The semiconductor device according to claim 1,
wherein each of said plurality of memory cells is comprised of a first MISFET and a variable resistive element,
a first terminal of said variable resistive element is connected to a common source line,
a second terminal of said variable resistive element is connected to one of source/drain of said first MISFET,
a gate of said first MISFET is connected to any one of said plurality of word lines, and
the other of the source/drain of said first MISFET is connected to said first bit line.

9. The semiconductor device according to claim 8,
wherein a sixth switch for providing a fourth potential is disposed on said first bit line,
said fourth potential is provided to said common source line, and
said fourth potential is lower than said first and second potentials.

10. A semiconductor device comprising:
a plurality of word lines;
a first bit line;
a second bit line;
a sense amplifier;
a plurality of memory cells disposed at arbitrary intersecting points of said plurality of word lines and said first and second bit lines;
a third bit line and a fourth bit line connected to said sense amplifier;
a first switch for providing a first potential to said first bit line;
a second switch for providing a second potential to said second bit line;
a third switch for providing a third potential to said third bit line;
a fourth switch for providing said third potential to said fourth bit line;
a fifth switch for connecting said first bit line with said third bit line; and
a sixth switch for connecting said second bit line with said fourth bit line,
wherein, after said first switch is activated and a first period elapses, inactivation of said first switch and activation of any of said plurality of word lines are performed, and after a second period elapses, said fifth and sixth switches are activated for a third period.

11. The semiconductor device according to claim 10,
wherein a seventh switch for providing said second potential is connected to said first bit line, and
after said third period elapses, said fifth and sixth switches are inactivated, said sense amplifier is activated, and said second and seventh switches are activated.

12. The semiconductor device according to claim 10,
wherein said first potential is higher than said second potential, and
said third potential is higher than said first potential.

13. The semiconductor device according to claim 10,
wherein each of said plurality of memory cells is comprised of a variable resistive element and a first MISFET,
a first terminal of said variable resistive element is connected to said first bit line,
a second terminal of said variable resistive element is connected to one of source/drain of said first MISFET,
a gate of said first MISFET is connected to any one of said plurality of word lines, and
the other of the source/drain of said first MISFET is connected to a common source line.

14. The semiconductor device according to claim 13,
wherein said second potential is provided to said common source line.

15. The semiconductor device according to claim 10,
wherein each of said plurality of memory cells is comprised of a first MISFET and a variable resistive element,
a first terminal of said variable resistive element is connected to a common source line,
a second terminal of said variable resistive element is connected to one of source/drain of said first MISFET,
a gate of said first MISFET is connected to any one of said plurality of word lines, and
the other of the source/drain of said first MISFET is connected to said first bit line.

16. The semiconductor device according to claim 15,
wherein said second potential is provided to said common source line.

17. The semiconductor device according to claim 10, further comprising:
a seventh switch for providing said second potential to said first bit line;

an eighth switch for providing said first potential to said second bit line;
a ninth switch for connecting said second bit line with said third bit line; and
a tenth switch for connecting said first bit line with said fourth bit line.

18. The semiconductor device according to claim 17, further comprising:
a fifth bit line disposed in parallel to said first bit line;
a sixth bit line disposed in parallel to said second bit line;
an eleventh switch for connecting said fifth bit line with said third bit line; and
a twelfth switch for connecting said sixth bit line with said third bit line.

19. The semiconductor device according to claim 18, further comprising:
a thirteenth switch for providing said first potential to said fifth bit line; and
a fourteenth switch for providing said first potential to said sixth bit line.

20. The semiconductor device according to claim 11, wherein said semiconductor device activates said second switch and said seventh switch during a waiting period.

* * * * *